(12) United States Patent
Fujisawa et al.

(10) Patent No.: US 6,512,719 B2
(45) Date of Patent: Jan. 28, 2003

(54) SEMICONDUCTOR MEMORY DEVICE CAPABLE OF OUTPUTTING AND INPUTTING DATA AT HIGH SPEED

(75) Inventors: Hiroki Fujisawa, Sagamihara (JP); Masayuki Nakamura, Ome (JP)

(73) Assignee: Hitachi, Ltd., Tokyo (JP)

( * ) Notice: Subject to any disclaimer, the term of this patent is extended or adjusted under 35 U.S.C. 154(b) by 5 days.

(21) Appl. No.: 09/897,997

(22) Filed: Jul. 5, 2001

(65) Prior Publication Data

US 2002/0003736 A1 Jan. 10, 2002

(30) Foreign Application Priority Data

Jul. 5, 2000 (JP) .......................... 2000-204288

(51) Int. Cl.$^7$ .................................. G11C 8/18
(52) U.S. Cl. ................... 365/233; 365/220; 365/221; 365/189.05; 365/194; 365/51
(58) Field of Search ................. 365/233, 220, 365/189.05, 221, 194, 191, 51, 230.03

(56) References Cited

U.S. PATENT DOCUMENTS

| | | | |
|---|---|---|---|
| 5,289,413 A | 2/1994 | Tsuchida et al. | 365/189.02 |
| 5,572,477 A | 11/1996 | Jung | 365/221 |
| 5,825,709 A | 10/1998 | Kobayashi | 365/230.03 |
| 5,881,009 A | 3/1999 | Tomita | 365/221 |
| 5,881,017 A | 3/1999 | Matsumoto et al. | 365/230.04 |
| 5,892,730 A | 4/1999 | Sato et al. | 365/233 |

FOREIGN PATENT DOCUMENTS

| | | | |
|---|---|---|---|
| JP | 4-162286 | 6/1992 | G11C/11/401 |
| JP | 7-272479 | 10/1995 | G11C/11/401 |
| JP | 7-272481 | 10/1995 | G11C/11/401 |
| JP | 7-282583 | 10/1995 | G11C/11/409 |
| JP | 9-198873 | 7/1997 | G11C/11/41 |
| JP | 10334659 | 12/1998 | G11C/11/407 |
| JP | 10340579 | 12/1998 | G11C/11/407 |
| JP | 1116361 | 1/1999 | G11C/11/41 |
| JP | 1139871 | 2/1999 | G11C/11/407 |

*Primary Examiner*—Andrew Q. Tran
(74) *Attorney, Agent, or Firm*—Antonelli, Terry, Stout & Kraus, LLP

(57) ABSTRACT

First and second data is transferred in parallel through a first signal transmission path, amplified by first and second relay amplification circuits, and transmitted via a second signal transmission path to first and second output registers, and an output circuit is provided for serially outputting the first and second data held by the first and second output registers, respectively, on the basis of address information. With respect to data to be outputted first of the first and second data, output timing of the data to be outputted later is delayed, data to be outputted first is made to correspond to the first output register, data to be outputted later is made to correspond to the second output register, and the transfer rate of the second signal transmission path corresponding to the first output register is set higher than that of the second signal transmission path corresponding to the second output register.

23 Claims, 19 Drawing Sheets

SEMICONDUCTOR MEMORY DEVICE CAPABLE OF OUTPUTTING AND INPUTTING DATA AT HIGH SPEED

BACKGROUND OF THE INVENTION

The present invention relates to a semiconductor integrated circuit device and, more particularly, the invention relates to a technique which is effective for use in a semiconductor memory device having a large storage capacity and which is required to achieve high-speed reading of data.

It was found by a search conducted after the present invention was made that there are the following publications disclosing techniques which seem to be related to the present invention: Japanese Unexamined Patent Publication No. Hei 10(1998)-340579 (corresponding to U.S. Pat. No. 5,881,009, called publication 1 below), Japanese Unexamined Patent Publication No. Hei 11(1999)-39871 (corresponding to U.S. Pat. No. 5,881,017, called publication 2 below), Japanese Unexamined Patent Publication No. Hei 10(1998)-334659 (corresponding to U.S. Pat. No. 5,892,730, called publication 3 below), Japanese Unexamined Patent Publication No. Hei 9(1997)-198873 (corresponding to U.S. Pat. No. 5,825,709, called publication 4 below), Japanese Unexamined Patent Publication No. Hei 7(1995)-282583 (hereinbelow, called publication 5), Japanese Unexamined Patent Publication No. Hei 4(1992)-162286 (corresponding to U.S. Pat. No. 5,289,413, hereinbelow, called prior art 6), Japanese Unexamined Patent Publication No. Hei 7(1995)-272479 (corresponding to U.S. Pat. No. 5,572,477, hereinbelow, called publication 7), Japanese Unexamined Patent Publication No. Hei 7(1995)-272481 (hereinbelow, called publication 8), and Japanese Unexamined Patent Publication No. Hei 11(1999)-16361 (hereinbelow, called publication 9).

In relation to the present invention, the publications 1 to 9 will be briefly described as follows. In the technique disclosed in publication 1, when even-numbered data is outputted first, an operation timing of an odd-numbered data bus amplifier and that of an even-numbered data bus amplifier are made asynchronous with each other. In the techniques disclosed in publications 2 and 3, the operation timing of a read buffer at the ante-stage of a read register is pipeline operated on a unit basis. In the technique of publication 4, the operation timing of a sense amplifier at the ante-stage of an output latch is shifted according to the column. In the technique of publication 5, the operation timing of a sense amplifier at the ante-stage of an output latch is shifted. In the technique of publication 6, amplifiers at the ante-stage of output latches are alternately operated. In the technique of publication 7, the operation timing of a column switch at the ante-stage of an output latch is pipeline operated. In the technique of publication 8, the operation timing of a data detecting circuit at the ante-stage of an output latch is shifted according to an address. In the technique of publication 9, the driving capabilities of sense amplifiers at the ante-stage of latches are made various. In the publications 1 to 9, there is no description suggesting the necessity of realizing an increase in speed of a prefetch operation by a simple configuration, as is provided in the present invention described hereinlater.

SUMMARY OF THE INVENTION

A DDR SDRAM (Double Data Rate Synchronous Dynamic Random Access Memory) inputs/outputs data at both edges of a clock. When the DDR SDRAM operates at a clock frequency of 200 MHz, a data transfer rate of 400 Mbps which is double is achieved. When a chip having a configuration similar to that of an SDRAM has the DDR, the inside of the chip has to operate at a double frequency. This, however, cannot be realized by the same device. In the DDR SDRAM, the operation frequency in the chip is set to be equal to that of the SDRAM by a prefetch operation, and only the speed of the input/output of data is increased to realize 400 Mbps. The DDR SDRAM has a data transfer system from a main amplifier to an output buffer, which is largely different from that in the SDRAM.

In the SDRAM, about 20% of a current consumption ICC is considered to be charging/discharging currents of global input/output lines GIO as data transfer lines extending from the main amplifier to the output buffer. Consequently, when a prefetch operation is performed, the peak current becomes an issue. To be specific, when data is input/output on a 16-bit unit basis, 32 main amplifiers and 32 global input/output lines GIO which are double those provided in the SDRAM operate simultaneously in a 2N prefetch operation, and 64 main amplifiers and 64 global input/output lines GIO, which are four times as many as those in a 4N prefetch operation. The peak current is therefore an important issue. When a method of increasing the speed of the main amplification circuit and the global input/output line GIO is employed in order to improve the performance, a problem occurs in that the peak current further increases.

An object of the invention is to provide a semiconductor integrated circuit device comprising a signal transmission circuit having an increased data input/output speed and an improved operation margin with a simple configuration. Another object of the invention is to provide a semiconductor integrated circuit device comprising a semiconductor storage having, in addition to an increased processing speed and an improved operation margin, a reduced area and a reduced power consumption. The above and other objects of the invention and novel features will become apparent from the description in this specification and from the appended drawings.

The outline of a representative aspect of the invention disclosed in the application will be described as follows. First and second data is transferred in parallel through a first signal transmission path, amplified by first and second relay amplification circuits, and transmitted via a second signal transmission path to first and second output registers, and an output circuit for serially outputting the first and second data held by the first and second output registers, respectively, on the basis of address information is provided. In the first and second relay amplification circuits, with respect to one, to be outputted first, of the first and second data, an output timing of the other data to be outputted later to the second signal transmission path is delayed.

The outline of another representative aspect of the invention disclosed in the application will be described as follows. First and second data is transferred in parallel through a first signal transmission path, amplified by first and second relay amplification circuits, and transmitted via a second signal transmission path to first and second output registers, and an output circuit for serially outputting the first and second data held by the first and second output registers, respectively, on the basis of address information is provided. A selection circuit is provided for each of the first and second relay amplification circuits to make one, to be outputted first, of the first and second data correspond to the first output register and to make the other data to be outputted later correspond to the second output register, and the transfer rate of the second signal transmission path corresponding to the first output register is set to be higher than that of the second signal transmission path corresponding to the second output register.

DETAILED DESCRIPTION OF THE INVENTION

Figure 1:
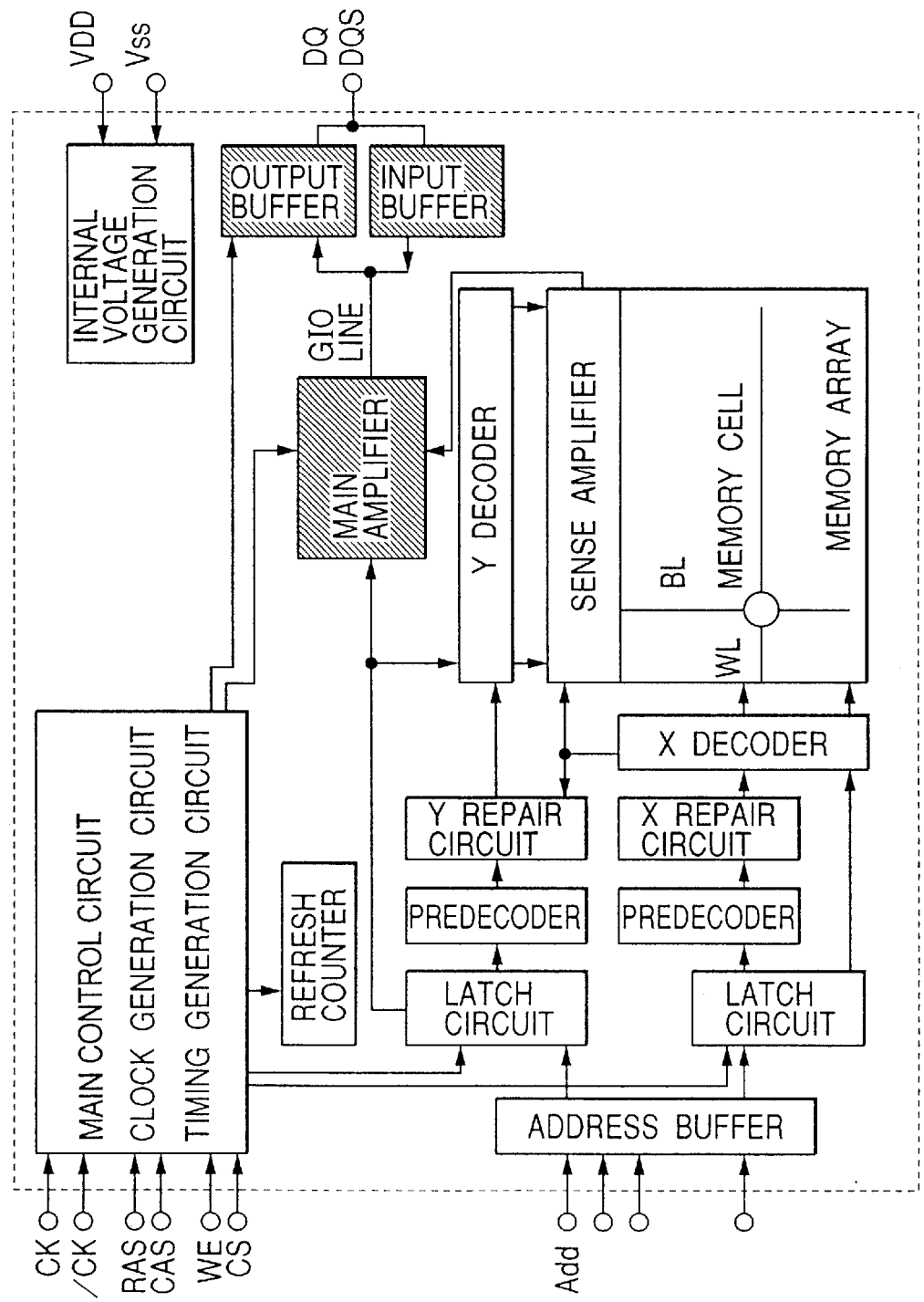
FIG. 1 is a general block diagram showing an embodiment of a DDR SDRAM according to the invention.

FIG. 1 is a general block diagram showing an embodiment of a DDR SDRAM according to the invention. Control input signals are a row address strobe signal /RAS, a column address strobe signal /CAS, a write enable signal /WE, and an output enable signal/OE. "/" denotes an over bar of a logic symbol expressing that the signal is active low. An X address signal and a Y address signal are time-sequentially entered from a common address terminal Add synchronously with clock signals CK and /CK.

The X address signal and the Y address signal entered through an address buffer are latched by separate latch circuits. The X address signal latched by the latch circuit is supplied to a predecoder, and an output signal of the predecoder is supplied to an X decoder where a selection signal of a word line WL is generated. By a word line selecting operation, a small read signal appears on a complementary bit line BL in a memory array and is amplified by a sense amplifier. The Y address signal latched by the latch circuit is supplied to a predecoder, and the output of the predecoder is supplied to a Y decoder where a selection signal of a bit line BL is generated. An X repair circuit stores a defect address, compares the stored defect address with the latched address signal and, when they coincide with each other, instructs the X decoder to select a spare word line, and inhibits selection of a normal word line. A Y repair circuit stores a defect address, compares the stored defect address with the latched address signal and, when they coincide with each other, instructs the Y decoder to select a spare bit line, and inhibits selection of a normal bit line.

The storage information amplified by the sense amplifier is selected by a not-illustrated column switching circuit, connected to a common input/output line, and transmitted to a main amplifier. The main amplifier is, although the invention is not so limited, provided with a write circuit as well. Specifically, in a reading operation, a read signal obtained through a Y switching circuit is amplified, and a resultant signal is outputted through an output buffer from an external terminal DQ. In a writing operation, a write signal entered from the external terminal DQ is captured via an input buffer and transmitted via the write circuit to a common input/output line and a selected bit line. On the selected bit line, a write signal amplified by the sense amplifier is transmitted, and corresponding charges are held in a capacitor in the memory cell.

A clock generating circuit (main control circuit) generates various timing signals necessary for the memory cell selecting operation, such as a control timing signal for capturing an address signal entered in correspondence with the clock signals CK and /CK and the signals /RAS and /CAS and a sense amplifier operation timing signal. An internal voltage generating circuit receives operation voltages, such as Vcc and Vss, supplied from power source terminals and generates various internal voltages, such as the plate voltage, a precharge voltage, such as Vcc/2, an internal boosted voltage VCH, an internal dropped voltage VDL, and a substrate back-bias voltage VBB. A refresh counter generates an address signal for refreshing and is used for a row address selecting operation in a refresh mode.

Figure 2:
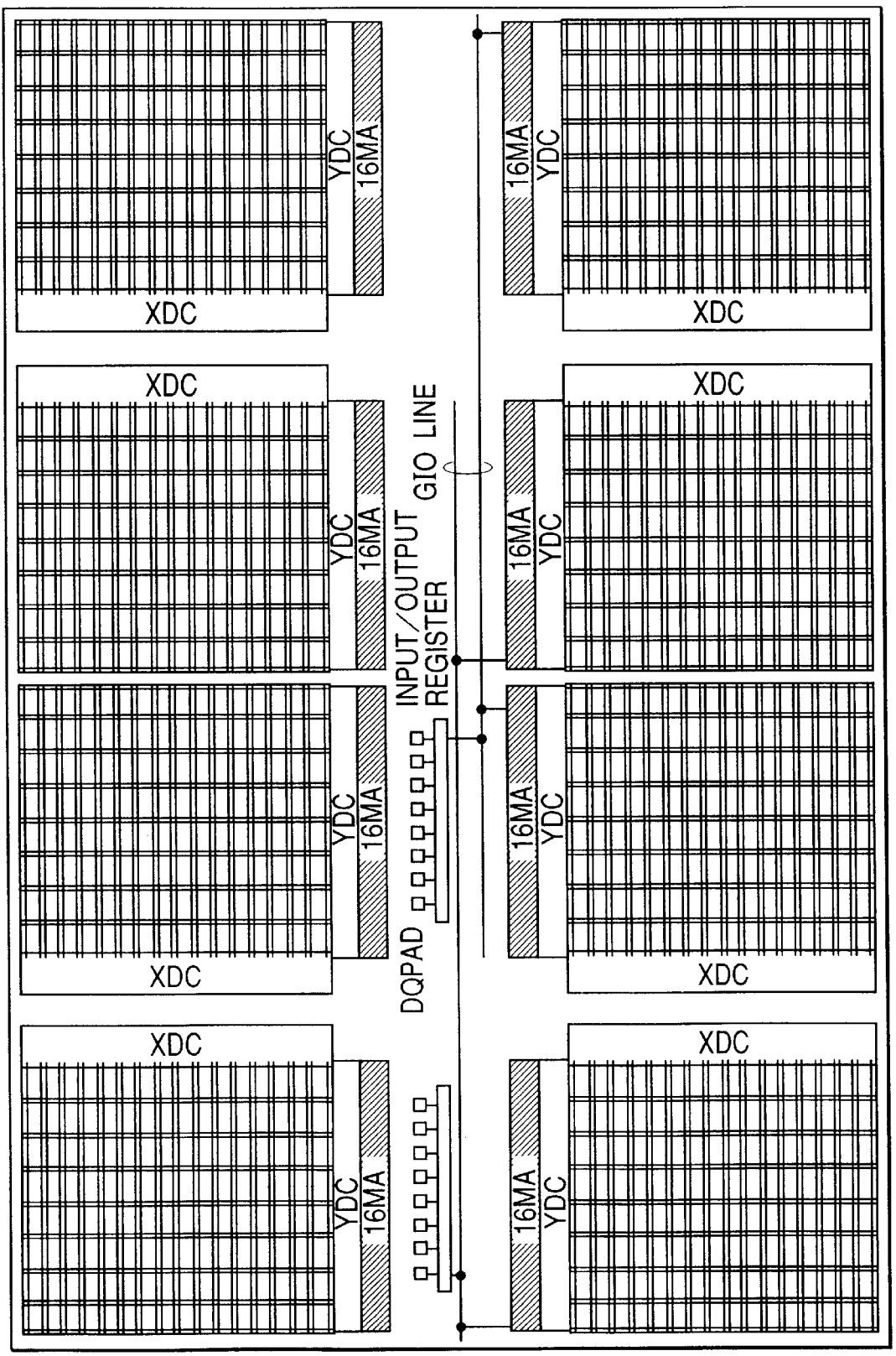
FIG. 2 is a diagram showing the overall configuration of a chip representing an embodiment of the DDR SDRAM according to the invention.

FIG. 2 is a diagram showing the configuration of a chip representing an embodiment of the DDR SDRAM according to the invention. In the SDRAM of the embodiment, the chip is divided into eight parts so as to form a plurality of memory blocks or banks. The eight blocks have similar configurations. An X decoder XDC is provided along one side of each memory array, and a Y decoder YDC and a main amplifier MA are disposed in the direction orthogonal to the X decoder XDC near to the center of the chip. The eight memory blocks are paired and the two memory blocks are disposed symmetrically with respect to the X decoders XDC so that the X decoders XDC are adjacent to each other, thereby forming a memory bank as described above. Two memory banks formed by two pairs of memory blocks are also disposed symmetrically in the vertical direction of the drawing. The Y decoders YDC and the main amplifiers MA are disposed so as to be adjacent to each other symmetrically with respect to peripheral circuits provided in the center in the vertical direction of the chip.

The memory array portion of a single memory block employs a hierarchical word line method of selecting a plurality of arrays disposed along word lines extending from the X decoders XDC in the vertical direction of the drawing and subword lines provided for the arrays by a main word line disposed so as to penetrate the plurality of arrays and a subword line selection line. By this technique, the number of memory cells connected to the subword line is decreased so that the subword line selecting operation is performed at higher speed.

The memory block has a plurality of arrays which are divided by Y selection lines extending from the Y decoder YDC, and the bit lines are divided on an array unit basis. With this configuration, the number of the memory cells connected to the bit line is decreased and a signal voltage read from the memory cell onto the bit line is assured. The memory cell takes the form of a dynamic memory cell. The state where a storage capacitor in the memory cell is charged corresponds to information "1", and the state where the storage capacitor is not charged corresponds to information "0". A reading operation is performed by coupling of the charge in the storage capacitor and a precharge on the bit line. Consequently, by decreasing the number of memory cells connected to the bit line, a necessary signal amount can be assured.

On the upper and lower sides of the divided array, subword driver lines are disposed, and sense amplifier lines are disposed on the right and left sides (in the bit line direction) of the array. In the sense amplifier line, a column selection circuit, a bit line precharge circuit, and the like are provided. A small potential difference appearing on each bit line by reading data from the memory cell selected by the word line (subword line) is detected and amplified by the sense amplifier.

A main input/output line MIO, which will be described hereinlater, although the invention is not so limited, extends through the subword driver line in the lateral direction of the drawing. A local input/output line LIO is disposed along the sense amplifier line. The local input/output line LIO and the main input/output line MIO are connected to each other by a row selection signal. In the peripheral circuit, the global input/output line GIO is disposed, and it is connected to the main input/output line MIO corresponding to the selected memory bank. The global input/output line GIO is connected to a pad DQPAD connected to an external terminal via the output and input buffers through an input/output register.

Although not illustrated, peripheral circuits as described below are provided in the center portion of the chip as appropriate. An address signal supplied from the address input terminal is captured in an address multiplex format by a row address buffer and a column address buffer. The supplied address signals are held by respective address buffers. For example, the row address buffer and the column address buffer hold the captured address signals for a period of one memory cycle. In the center portion of the chip, a repair circuit including a fuse and a MOSFET for performing address comparison is also provided.

The row address buffer captures a refresh address signal outputted from a refresh control circuit as a row address signal in the refresh operation mode. In the embodiment, although the invention is not so limited, the refresh address signal is captured as a row address signal via the clock generating circuit. The address signal captured by the column address buffer is supplied as preset data to the column address counter included in the control circuit. The column address counter outputs a column address signal as the preset data or a value obtained by sequentially incrementing the column address signal to the Y decoder YDC in accordance with an operation mode designated by a command which will be described hereinlater.

The control circuit receives, but the invention is not so limited, external controls signals, such as a clock signal, clock enable signal, chip select signal, column address strobe signal, row address strobe signal, write enable signal, and data input/output mask control signal and address signals corresponding to the memory banks; and, on the basis of a change in level, timing, and the like of each of the signals, it generates various controls signals for an operation mode of the DDR SDRAM and the like and corresponding various timing signals. The control circuit has a control logic and a mode register for the above operations.

Figure 3:
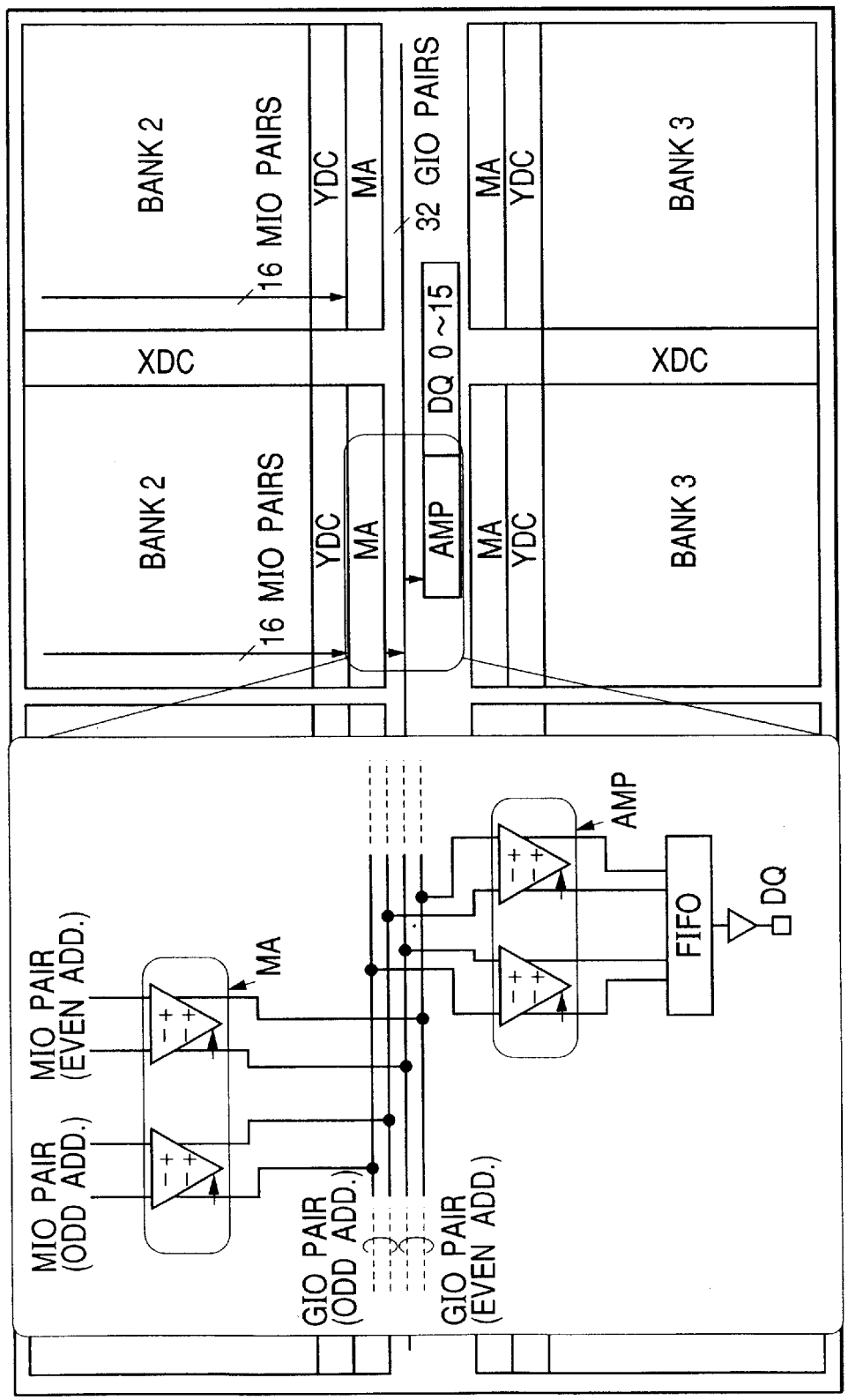
FIG. 3 is a diagram schematically showing the configuration of the embodiment of the whole DDR SDRAM according to the invention.

FIG. 3 is a diagram schematically showing the configuration of the whole DDR SDRAM according to the invention. The drawing corresponds to FIG. 2 and the chip is divided into eight memory arrays. Four memory arrays, representing half of the eight memory arrays, are shown as an example in the drawing. The other half of the drawing is an enlarged view of the portion related to the invention. Along one side of each memory array, the X decoder XDC is provided. In positions near to the center of the chip, the Y decoder YDC and the memory amplifier MA are disposed in the direction orthogonal to the X decoder XDC. The eight memory arrays are paired, and a pair of memory arrays are provided so as to be symmetrical with respect to the X decoder XDC. By providing two memory arrays sandwiching the X decoder XDC, one memory bank (Bank2) is constructed. The other memory bank (Bank3) is also constructed by the two memory arrays, as described above.

In a memory array, a plurality of arrays divided by the word lines extending in the vertical direction of the drawing from the X decoder XDC are provided. The hierarchical word line method of selecting a subword line provided for each of the arrays by a main word line extending so as to penetrate the plurality of arrays and the subword line selection line by a subword driver is employed. Likewise, the memory array has a plurality of arrays divided along the Y selection lines extending from the Y decode and a bit line is divided by the arrays.

The bit line is divided by the sense amplifier lines provided at both ends, and the local input/output line LIO is provided along the bit line. The local input/output line LIO is connected to the main input/output line MIO via a selection circuit selected by a row address. The memory bank (Bank2) shown representatively will be explained as an example. 16 pairs of main output/input lines MIO extend along the subword driver line in parallel with the Y selection line in each of the two memory arrays. In one memory bank (Bank2), therefore, 32 pairs of main input/output lines MIO are provided. In correspondence with the 32 pairs of main input/output lines MIO, 32 main amplifiers MA are provided.

Output signals of the 32 main amplifiers are supplied to 32 pairs of global input/output lines GIO extending in the vertical direction of the chip. The global input/output lines GIO are formed so as to extend in the vertical direction of the chip so as to be connected also to the main amplifiers MA provided in correspondence with the two memory banks (Bank0 and Bank2) provided in the lower half (not shown) of the chip.

The peripheral circuits are provided in the center portion of the chip. The drawing shows circuits in the output system related to the invention in the peripheral circuits as an example. The peripheral circuits include a row address buffer circuit and a column address buffer circuit for capturing an address signal supplied from an address input terminal (not shown) in the address multiplex format. The output system circuit is configured by an output buffer DQ0–15 and an amplification circuit Amp provided at the ante-stage of the output buffer DQ0–15. The output buffer DQ0–15 outputs data in parallel on the unit basis of 16 bits. 32 amplification circuits Amp are provided in correspondence with the global input/output lines GIO. A selection circuit (FIFO) is provided at an output portion of the amplification circuit Amp to transmit a 16-bit signal corresponding to an odd-number address or even-number address to 16 output buffers DQ0 to DQ15.

In the DDR SDRAM of the embodiment, in the two memory arrays in the single memory bank (Bank2), the main input/output line pairs MIO are divided into two groups for odd-numbered addresses and even-numbered addresses. In a reading operation, a 2N (where N denotes 16 in this case) prefetch operation is performed by selecting a total of 32 bits of 16 bits each from the two memory arrays in accordance with a column address signal, and the 32-bit data is output by using the global input/output lines GIO. The output circuit outputs data of 16 bits in a head address synchronously with the rising edge of a clock signal CLK and outputs the remaining data of 16 bits synchronously with the falling edge of the clock signal CLK.

Although the invention is not so limited, the embodiments shown in FIGS. 2 and 3 relate to a DDR SDRAM having a large storage capacity of about 256 Mbits. The chip is divided into eight memory blocks. Two blocks construct one bank. One memory block is divided into 8×16 arrays (submats). One submat has 512 bits×512 bits. That is, 512 memory cells are connected to one subword line, and 512 memory cells are connected to one bit line. In the following description, the main input/output line MIO will be simply called an MIO line and the global input/output line GIO will be simply referred to as a GIO line by using the reference characters.

In the embodiment, the main amplifiers, main amplifier output circuits, GIO lines, and output register circuits are assigned for odd-numbered and even-numbered addresses. As already stated, data transfer from the main amplifier to the output register with respect to both the odd-numbered and even-numbered addresses is performed simultaneously. Specifically, 32-bit data read on the MIO lines is simultaneously sensed by the main amplifiers and transferred to the output registers. In accordance with the odd-numbered or even-numbered start address, data in the output register is outputted synchronously with the rising edge and falling edge of the clock. In the embodiment, therefore, the 32 main amplifiers and the 32 GIO lines operate simultaneously.

Figure 4:
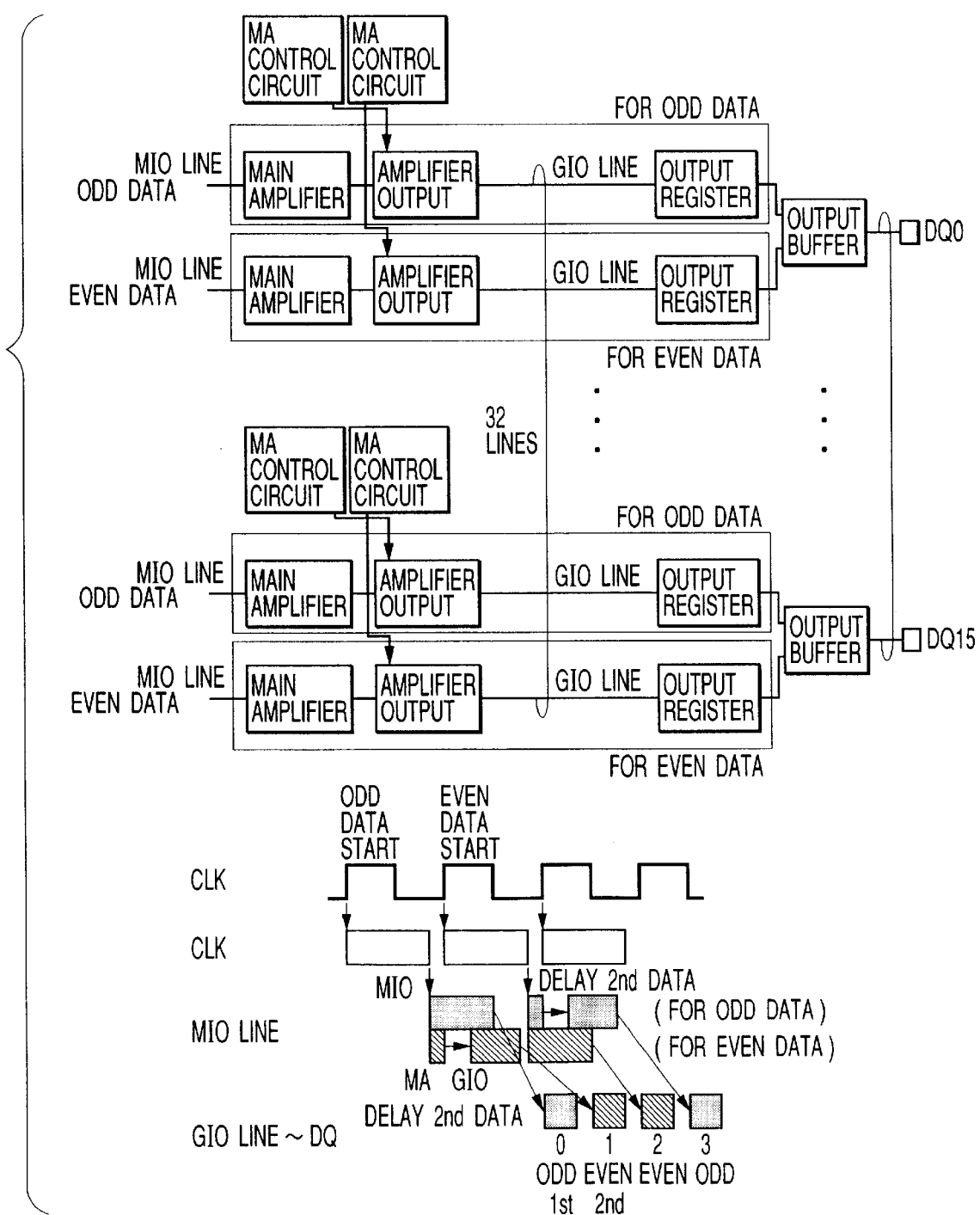
FIG. 4 is a block diagram showing an embodiment of a read circuit of the DDR SDRAM according to the invention.

FIG. 4 is a diagram showing the configuration of an embodiment of a reading system in the DDR SDRAM according to the invention. The embodiment is directed to the 2N prefetch operation as described above. Specifically, to reduce the peak current at the time of sensing 32-bit data loaded to the MIO lines by the main amplifiers and transferring the data in parallel to the output registers via the GIO lines, data transferred through the GIO lines is outputted so that first output data and second output data is outputted at different timings.

The reading system has a configuration in which 16 main amplifiers, 16 amplifier output circuits, 16 GIO lines, and 16 output registers are provided for each of odd-number data and even-numbered data in correspondence with the input/output terminals DQ0 to DQ15. The amplifier output circuit is provided with an MA control circuit for adjusting the output timing of the amplifier output circuit. Odd-numbered data (or even-numbered data) to be outputted first in accordance with start address information is transmitted as it is through the GIO lines to the output registers. Even-numbered data (or odd-numbered data) to be outputted later is delayed by the MA control circuits, and then it is transmitted to the output registers via the GIO lines. The MA control circuits are separately used for odd-numbered data and even-numbered data and are controlled to output, according to the start address, first output data (synchronized with the rising edge of the clock) as it is to the GIO lines and to delay the second output data (synchronized with the falling edge of the clock) and output the data to the GIO lines.

For example, when the start address is an odd-numbered address (hereinbelow, described as "ODD start"), a memory cell is selected in correspondence with both the odd-numbered and even-numbered addresses, data is loaded to the sense amplifier, LIO, and MIO and captured by the main amplifier MA. In the case of the ODD start, as described above, first data which is odd-numbered data is supplied to the main amplifier MA, and an output signal of the main amplifier MA is transferred as it is via the GIO line to the output register. After that, second data which is even-numbered data is delayed and transferred to the output register.

When an EVEN start is instructed at the next clock, a memory cell is similarly selected in correspondence with both the odd-numbered and even-numbered addresses. Synchronously with the second clock signal CLK, data is loaded to the sense amplifier, LIO, and MIO and captured by the main amplifier MA. In the case of the EVEN start, as described above, first data which is even-numbered data is supplied to the main amplifier MA, and an output signal of the main amplifier MA is transferred as it is via the GIO line to the output register. After that, second data which is odd-numbered data is delayed and transferred to the output register.

Although the invention is not so limited, odd-numbered data "0" which is address-designated first is outputted at the rising edge of the third clock CLK, and even-numbered data "1" read simultaneously is outputted at the falling edge of the clock signal CLK. Even-numbered data "2" which is address-designated second is outputted at the rising edge of the fourth clock CLK, and odd-numbered data "3" read simultaneously is outputted at the falling edge of the clock signal CLK. Subsequently, the memory cell selecting operation, data transferring operation, and data outputting operation are similarly performed synchronously with the clock signals CLK in a pipeline manner.

According to the embodiment, in the DDR SDRAM using the 2N prefetch architecture as described above, the number of GIO lines simultaneously charged/discharged can be reduced from 32 to 16. Likewise, a DDR SDRAM using a 4N prefetch architecture also can be constructed. In this case, the number of GIO lines simultaneously charged/discharged can be reduced from 64 to 16. Since the second output data has a margin of time of a half clock, even if the transfer timing in the GIO line is delayed, the performance of the data outputting operation does not deteriorate.

Figure 5:
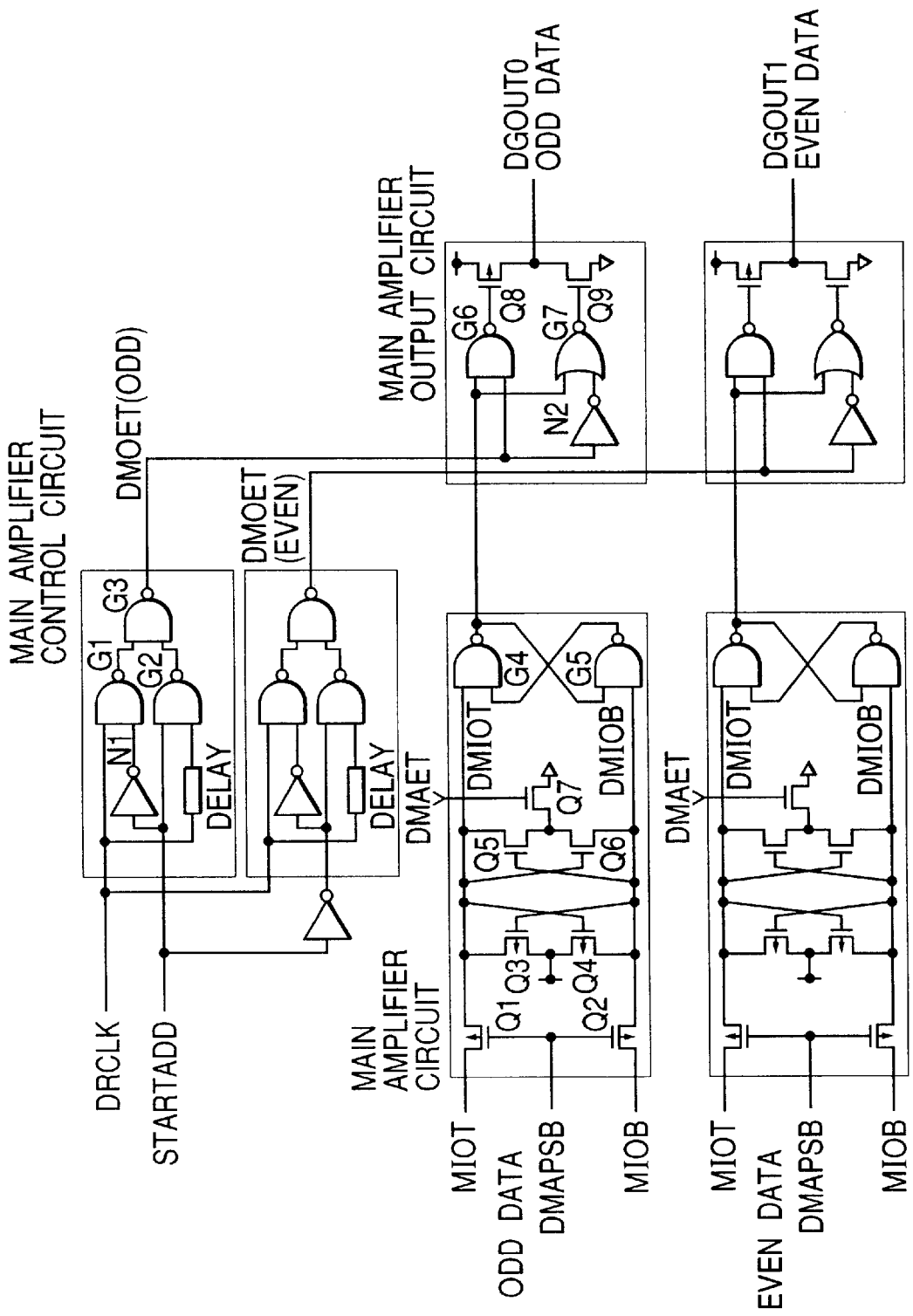
FIG. 5 is a circuit diagram showing an embodiment of main amplifiers used for the DDR SDRAM according to the invention.

FIG. 5 is a circuit diagram of an embodiment of the main amplifier used for the DDR SDRAM according to the invention. In the embodiment, a pair of main amplifiers, a pair of main amplifier output circuits, and a pair of main amplifier control circuits corresponding to the 2N prefetch architecture are expressed as an example. An odd-numbered data side circuit in the pair of circuits for odd-numbered and even-numbered data will be described specifically. The main amplifier captures signals of a pair of main input/output lines MIOT and MIOB through P-channel type MOSFETs Q1 and Q2 which are turned on when a timing signal DMAPSB goes low.

The captured signals are amplified by a CMOS latch circuit having P-channel type MOSFETs Q3 and Q4 and N-channel type MOSFETs Q5 and Q6 having gates and drains connected so as to cross each other and an N-channel type MOSFET Q7 for passing an operation current provided between the commonly connected sources of the N-channel type MOSFETs Q5 and Q6 and the ground potential of the circuit. Specifically, an input signal is latched while the timing signal DMAPSB is at the low level. When a desired signal amount is assured, the timing signal DMAPSB goes high, and the main input/output lines MIOT and MIOB and input/output terminals of the latch circuit are isolated from each other. When a timing signal DAMAET goes high, the latch circuit starts an amplifying operation. Since the MIO lines having large parasitic capacity are isolated, the CMOS latch circuit amplifies signals transmitted via the MIO lines to the CMOS level at high speed, and the amplified signals are latched by a latch circuit constructed by gate circuits G4 and G5.

In the main amplifier output circuit, an output signal of the main amplifier is transmitted through gate circuits G6 and G7 controlled by a timing signal DMOET (ODD) to an output circuit constructed by a P-channel type output MOSFET Q8 and an N-channel type output MOSFET Q9. The main amplifier output circuit amplifies the output signal captured by itself, to thereby generate an output signal DGOUTO to be transmitted to the GIO line.

The circuit, as an example, is characterized in that, in the main amplifier control circuit, the timing of a main amplifier output signal is controlled according to a start address signal (STARTADD). Specifically, in the case of the ODD start, STARTADD=L (low level). A gate circuit G1 for selectively transmitting a clock signal DRCLK and a delay signal opens its gate to transmit the clock signal DRCLK to the main amplifier output circuit. Odd-numbered data is therefore outputted first in synchronism with the clock signal DRCLK.

In contrast to the odd-numbered data side, in the main amplifier control circuit on the even-numbered data side, a gate circuit G2 opens its gate to transmit a delay signal to the main amplifier output circuit on the even-numbered data side. Even-numbered data is therefore delayed only by a delay time set in a delay circuit provided for the main amplifier control circuit. In the case of the EVEN start, an operation in which the even-numbered data side and the odd-numbered data side are opposite is performed. In the main amplifier control circuit as described above, an output timing of the main amplifier, that is, a transfer timing of the odd-numbered and even-numbered data transferred through the GIO lines is switched in accordance with the start address. Consequently, the start address may be arbitrary, and, moreover, the memory cell address selecting circuit and the read signal transmitting path can be made uniform.

Figure 6:
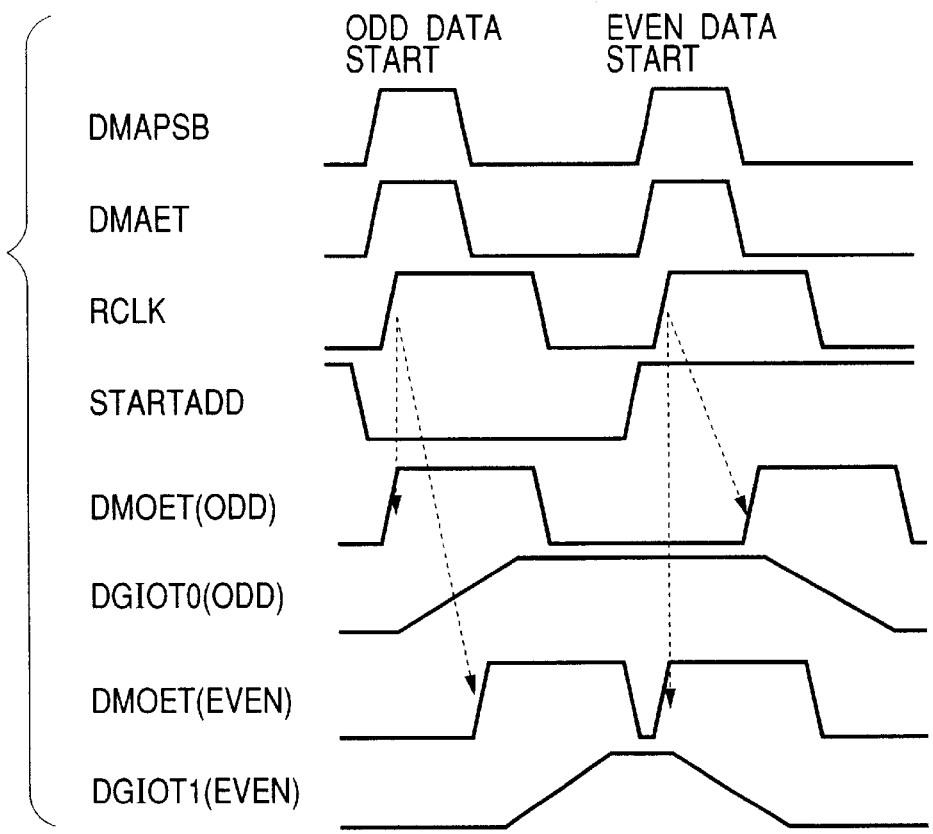
FIG. 6 is a waveform chart for explaining an example of the operation of the main amplifiers of FIG. 5.

FIG. 6 is a waveform chart illustrating an example of the operation of the main amplifier in FIG. 5. After starting the main amplifier (by the timing signal DMAET), the timing of the main amplifier output signal (timing signal DMOET) to the GIO line is controlled so that either the odd-numbered data or even-numbered data is outputted first, and the other is outputted later in accordance with the start address. Therefore, by shifting timings of charging/discharging the GIO lines, that is, the output signal DGIOTO (ODD) and an output signal DGIOT1 (EVEN), the peak current can be reduced.

Figure 7:
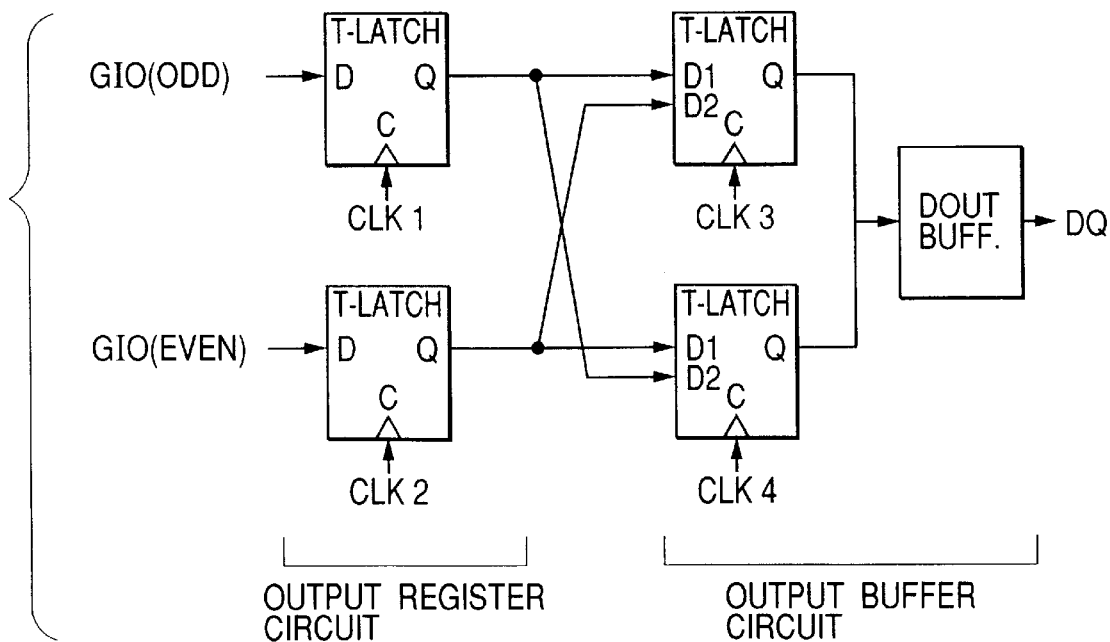
FIG. 7 is a circuit diagram showing an embodiment of an output circuit for use in the DDR SDRAM according to the invention.

FIG. 7 is a circuit diagram showing an embodiment of the output circuit. The output circuit in the embodiment is constructed by an output register circuit and an output buffer circuit. In the embodiment, as the output register circuit, a through latch (T-latch) is used. The output register circuit outputs through data in the period during which the clock signals CLK1 and CLK2 are at the high level and latches data when the clock signals CLK1 and CLK2 are at the low level. The output buffer circuit is constructed by using a two-input through latch (T-latch) and a buffer circuit (Dout Buff). The circuit selects either the odd-numbered data or even-numbered data in accordance with the start address and outputs the selected one synchronously with a clock. The circuit is just an example. A similar circuit operation can be performed by using another circuit.

Figure 8:
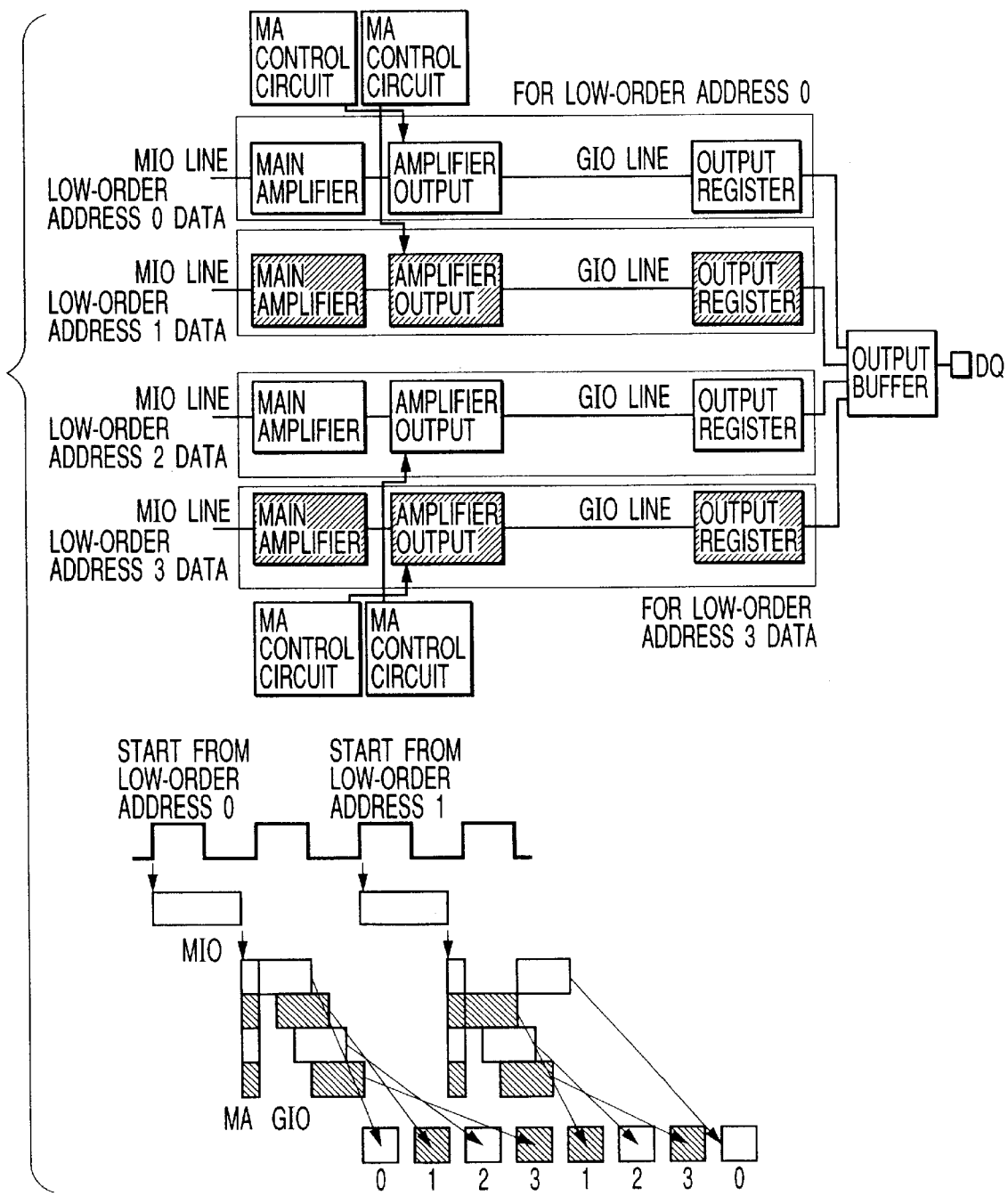
FIG. 8 is a diagram showing the configuration of another embodiment of the read circuit in the DDR SDRAM according to the invention.

FIG. 8 is a diagram showing the configuration of another embodiment of the reading system of the DDR SDRAM according to the invention. The embodiment is directed to a 4N prefetch architecture. In the case of the 4N prefetch architecture, four bits of the low addresses (0 to 3) are simultaneously loaded from the memory cells to the MIO lines and simultaneously sensed by the main amplifiers. In the embodiment, the main amplifier control circuit is provided for each of the low-order addresses. Timings of outputting data to the GIO lines are controlled to be shifted in accordance with the start address.

For example, when the start address is "0", data in the address "0" is outputted first. After that, data is outputted while shifting the output timing in accordance with the order of addresses (0, 1, 2, and 3 in the case of sequential data). When the start address is "1", data in the address "1" is outputted first. After that, data is outputted while shifting the output timing in accordance with the order of addresses (1, 2, 3, and 0 in the case of sequential data). In the configuration, therefore, since the main amplifier control circuit is provided for each low-order address, the effects of the method as described above can be obtained without depending on the start address.

Figure 9:
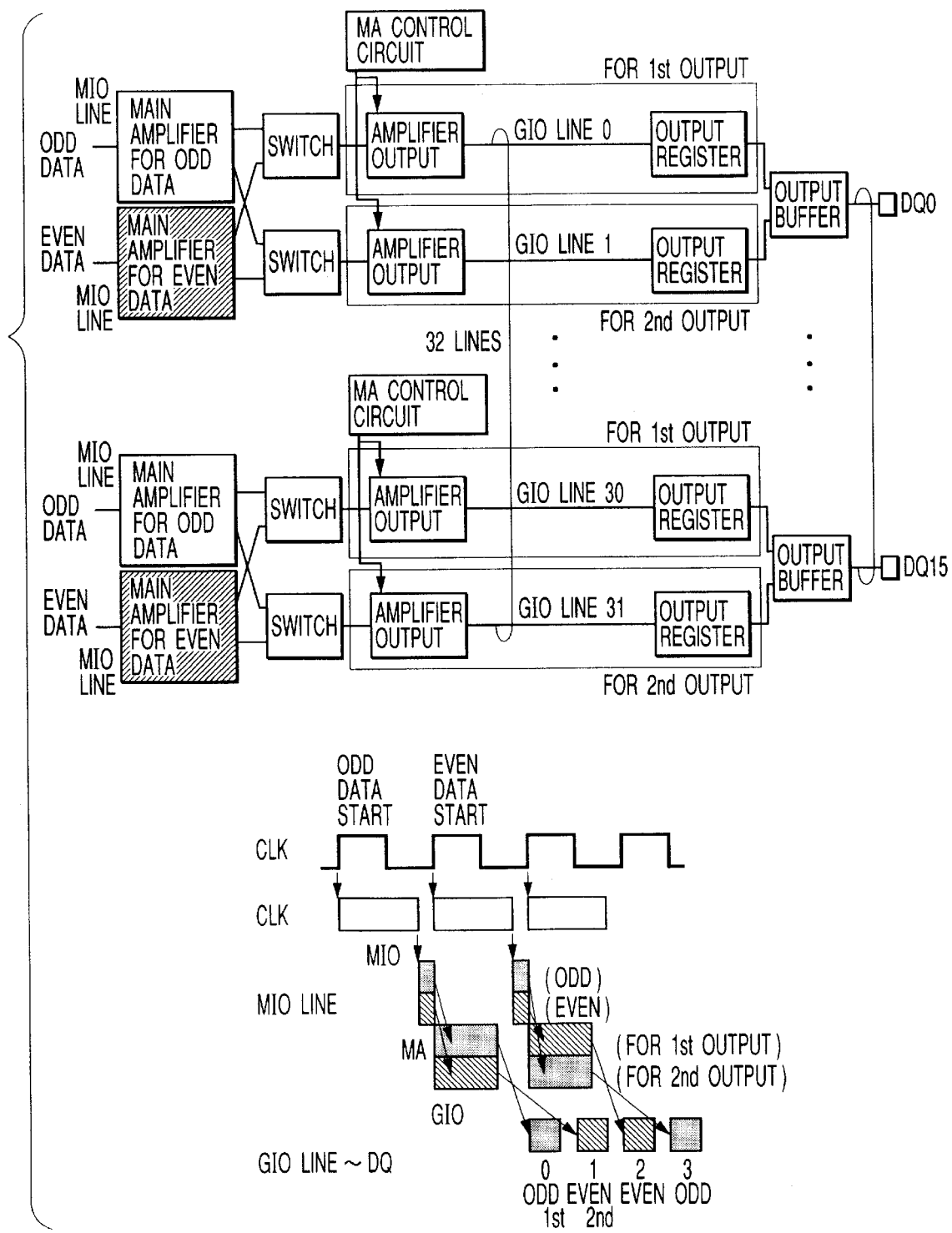
FIG. 9 is a diagram showing the configuration of another embodiment of the read circuit in the DDR SDRAM according to the invention.

FIG. 9 is a diagram showing the configuration of another embodiment of the reading system of the DDR SDRAM according to the invention. The embodiment is directed to a 2N prefetch architecture. The embodiment is characterized in that, unlike the embodiment of FIG. 4 where the main amplifier output circuits, GIO lines, and output register circuits are assigned to odd-numbered data and to even-numbered data, signal transmission paths used synchronously with timings of data to be transferred such as first output data and second output data, are assigned. To be specific, 32 bits are simultaneously read by the main amplifiers. A switching circuit for switching data to a GIO line according to the start address at the time of outputting data to the GIO line is provided at an input portion of the amplifier output circuit.

In the embodiment, even-numbered GIO lines (0, 2, . . . 30) are assigned for the first output data, and odd-numbered GIO lines (1, 3, . . . 31) are assigned to the second output data. In the case of the ODD start, therefore, data of the main amplifiers for odd-numbered data is outputted to the even-numbered GIO lines, and the data of the main amplifiers for even-numbered data is outputted to the odd-numbered GIO lines. In the case of the EVEN start as well, data of the main amplifiers for even-numbered data is outputted to the even-numbered GIO lines, and data of the main amplifiers for odd-numbered data is outputted to the odd-numbered GIO lines. In the embodiment, it is unnecessary to provide the out-put register with address information, and an output timing control is facilitated.

Figure 10:
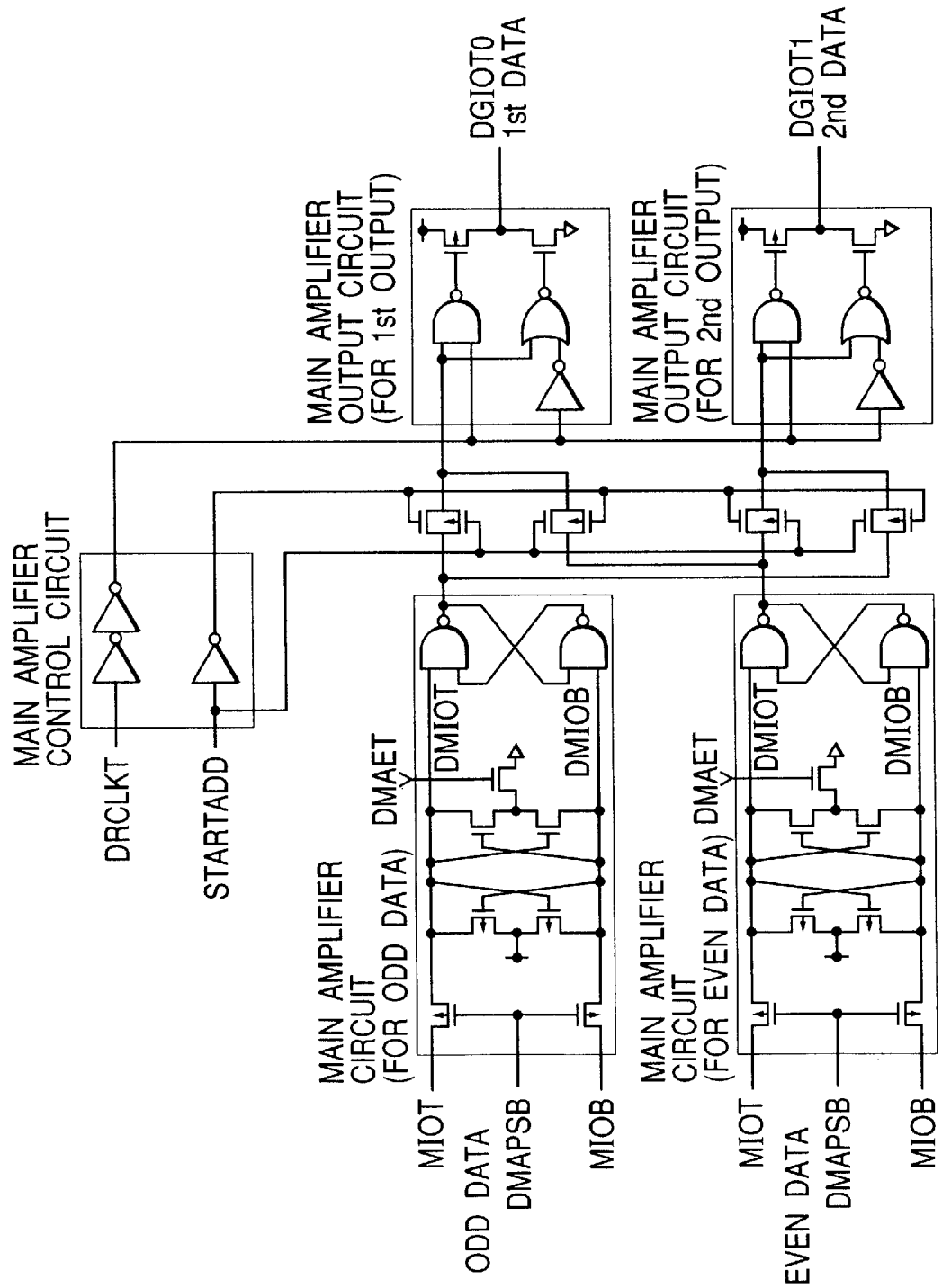
FIG. 10 is a circuit diagram showing another embodiment of the main amplifier for use in the DDR SDRAM according to the invention.

FIG. 10 is a circuit diagram showing another embodiment of the main amplifier for use in the DDR SDRAM according to the invention. In the embodiment, a pair of main amplifiers, switching circuits, main amplifier output circuits, and a main amplifier control circuit in the embodiment of FIG. 9 are shown as an example. Since the main amplifier and the main amplifier output circuit are similar to those in the embodiment of FIG. 5, their description will not be repeated.

The switching circuit is provided between the main amplifier and the main amplifier output circuit. The switching circuit has a CMOS switch for transmitting an output of the main amplifier for odd-numbered data to either the main amplifier output circuit for first output data or the main amplifier output circuit for second output data, and a CMOS switch for transmitting an output of the main amplifier for even-numbered data to either the main amplifier output circuit for first output data or the main amplifier output circuit for second output data.

In the case of transmitting an output of the main amplifier for odd-numbered data to the main amplifier output circuit for the first output data, the pair of CMOS switches transmit the output of the main amplifier for even-numbered data to the main amplifier output circuit for the second output data. On the contrary, in the case of transmitting the output of the main amplifier for odd-numbered data to the main amplifier output circuit for the second output data, the pair of CMOS switches transmit the output of the main amplifier for even-numbered data to the main amplifier output circuit for the first output data. In each of the main amplifier output circuits for the first and second output data, therefore, collision between the data of the main amplifier for odd-numbered data and data of the main amplifier for even-numbered data is prevented.

The circuit of the embodiment is characterized in that the main amplifier output circuits and the GIO lines are assigned to the first and second output data as described above, and the result of amplification of the main amplifier is switched according to the start address and is outputted. Specifically, in the case of an ODD start, STARTADD=L (low level). In response to the control signal generated by the main amplifier control circuit, the main amplifier for odd-numbered data is connected to the main amplifier output circuit for the first output data and the main amplifier for even-numbered data is connected to the main amplifier output circuit for the second output data. In the case of a EVEN start, the connection is performed in an opposite manner.

Figure 11:
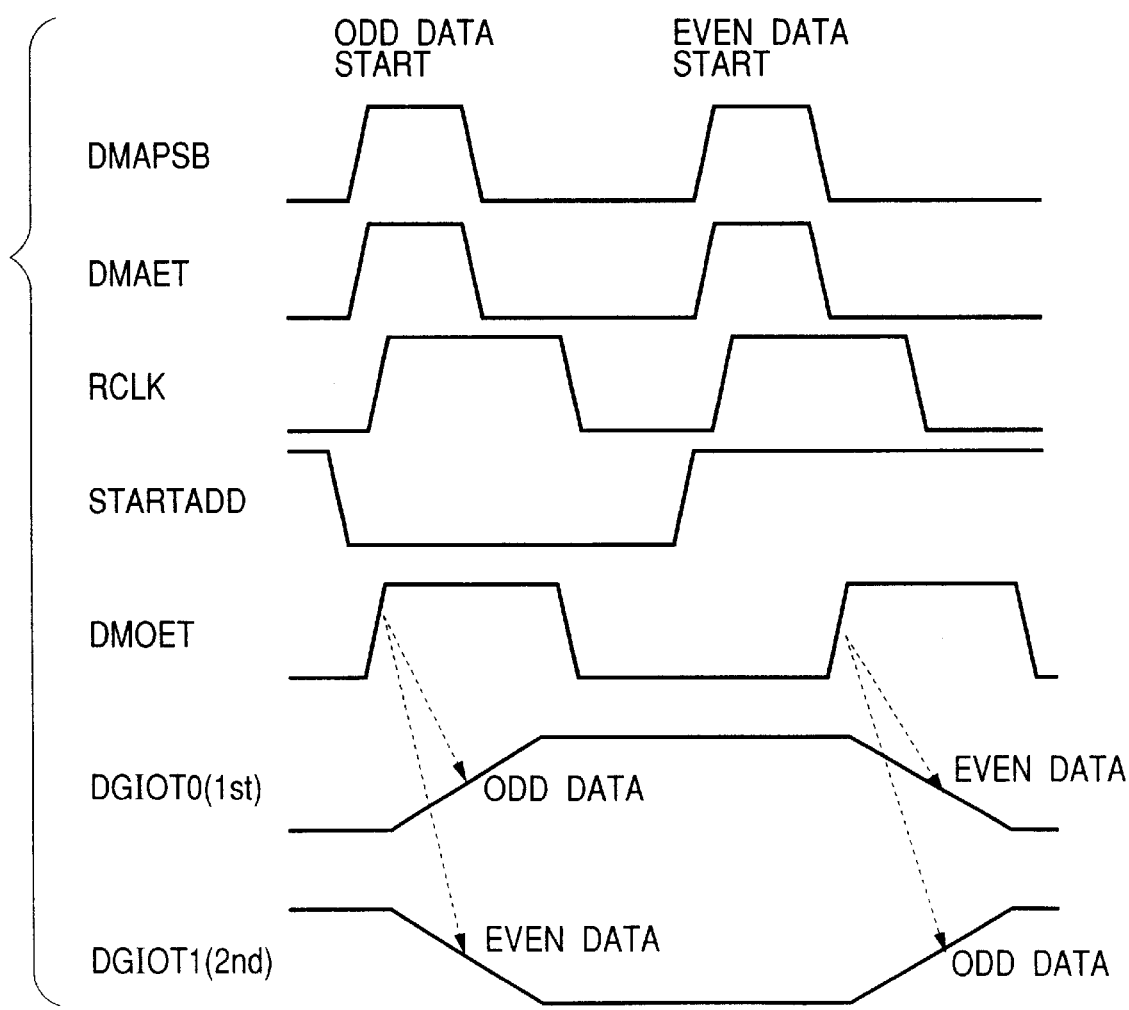
FIG. 11 is a waveform chart illustrating an example of the operation of the main amplifier of FIG. 10.

FIG. 11 is a waveform chart illustrating an example of the operation of the main amplifier in FIG. 10. The switching circuit (selector) is provided between the main amplifier and the main amplifier output circuit to select a GIO line in accordance with the start address information. In the case of the ODD start, therefore, odd-numbered data is outputted to the GIO line (DGIOT0) for the first output data, and even-numbered data is outputted to the GIO line (DGIOT1) for the second output data. In the case of an EVEN start, the connection is made in an opposite manner.

Figure 12:
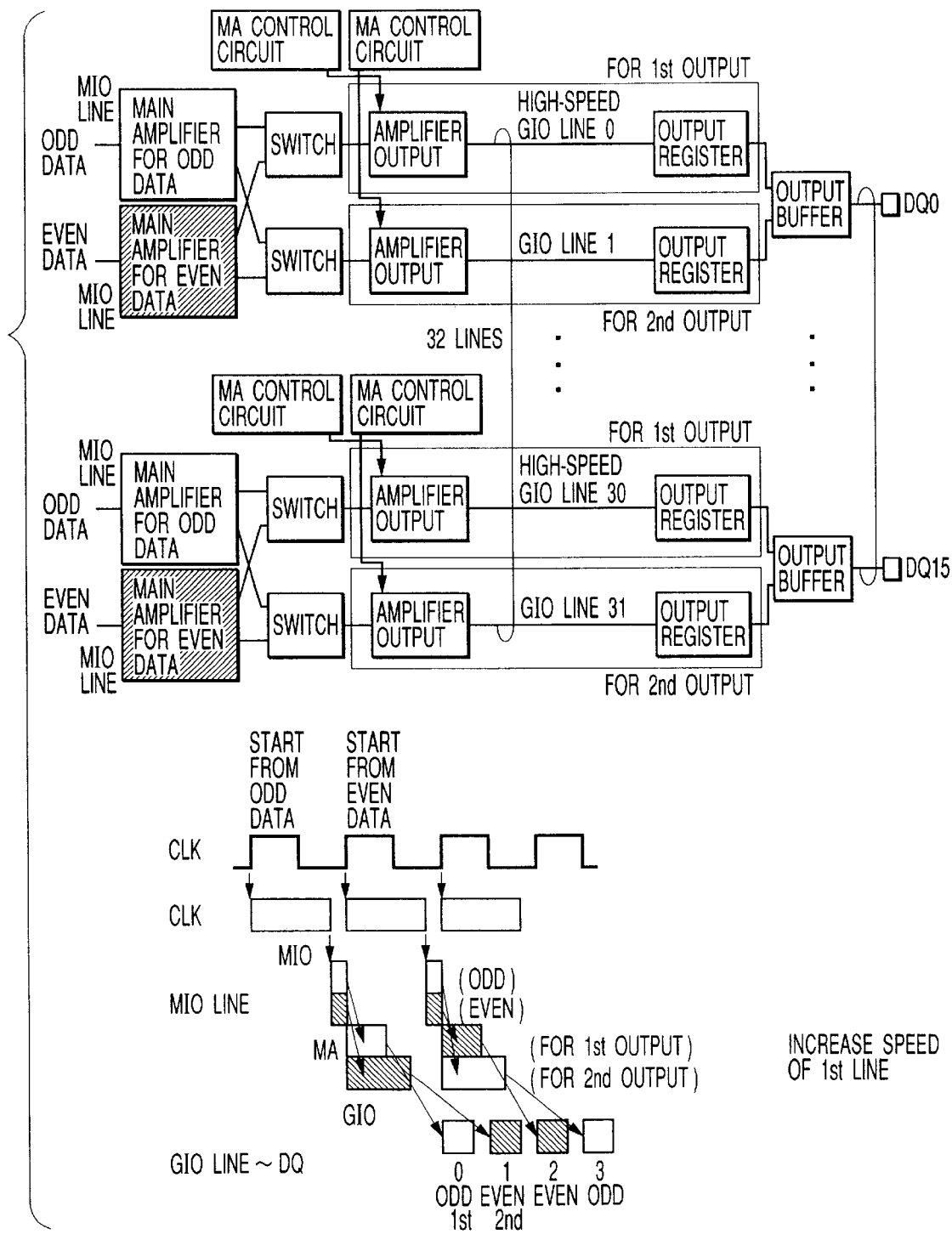
FIG. 12 is a diagram showing the configuration of another embodiment of the read circuit in the DDR SDRAM according to the invention.

FIG. 12 is a diagram showing the configuration of another embodiment of the reading system of the DDR SDRAM according to the invention. The embodiment is a modification of the embodiment of FIG. 11 and is characterized in that the GIO line for the first output data has an increased transfer speed. Specifically, any of the methods of increasing the signal transfer rate can be applied to the GIO line for the first output data, and a normal signal transmission line is used as the GIO line for the second output data.

There are the following methods of increasing the signal transmission rate of the GIO line. (a) The pit of the GIO lines is lowered. For example, by doubling L/S, the wiring resistance and capacity are reduced. (b) The GIO lines are divided into two groups for reading and writing. Usually, the GIO lines are commonly used for reading and writing operations to reduce the number of lines. By dividing the GIO lines for reading and writing operations, the load is reduced. (c) A signal having a small amplitude is transferred via the GIO line. For example, a small amplitude interface, such as GTL or SSTL, is employed. By such methods, the speed of the GIO line for the first output data as an access bus is increased, so that the access time can be shortened. By using this configuration, the circuit scale can be reduced to one half as compared with a configuration in which the speed of all of the GIO lines is increased.

Figure 13:
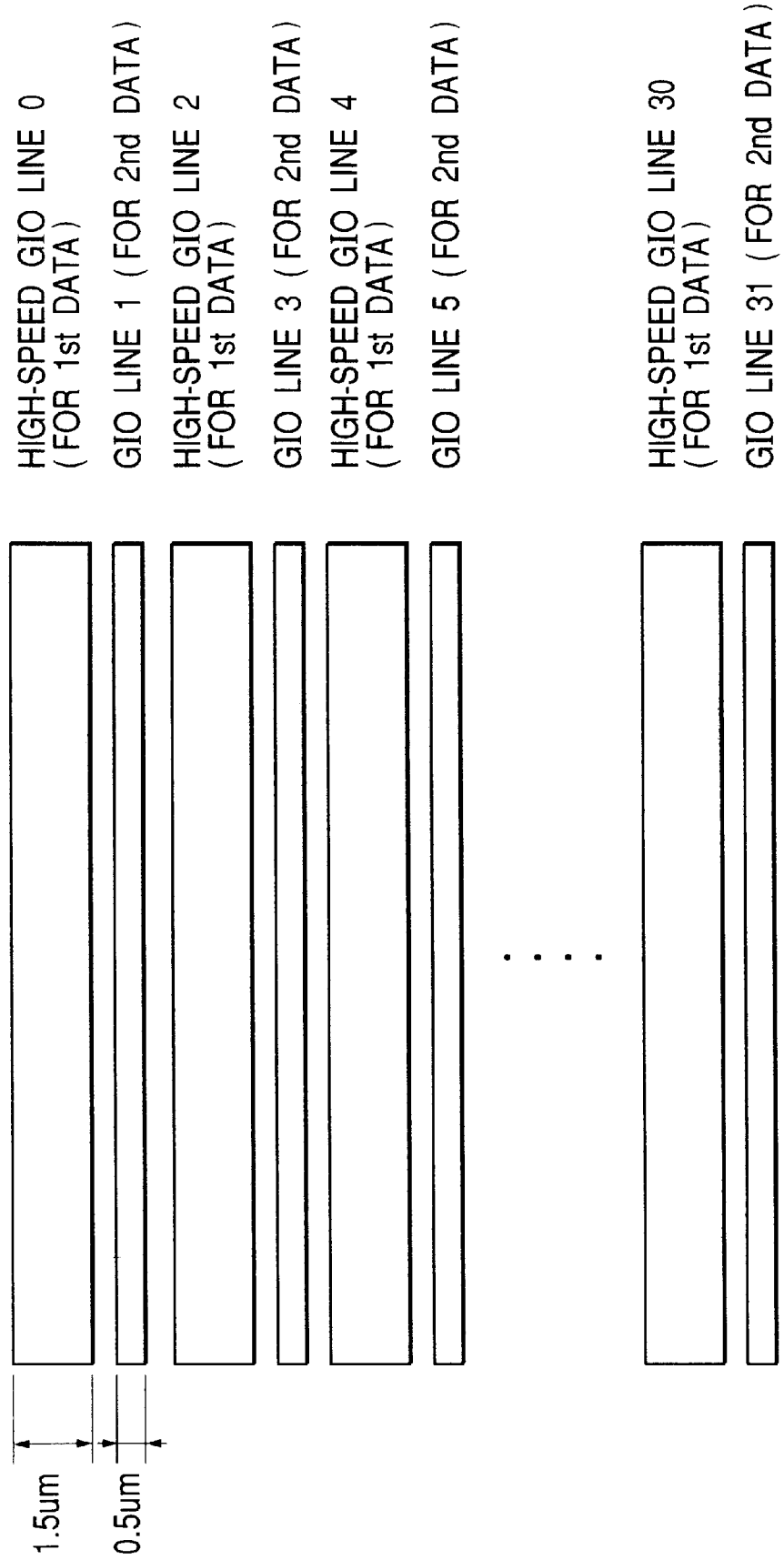
FIG. 13 is a diagram showing an example of patterns of GIO lines used in the DDR SDRAM according to the invention.

FIG. 13 is a diagram showing patterns of an embodiment of the GIO lines. In the embodiment, an example is shown in which the pitch of the GIO lines is varied to increase the speed. The GIO line for first output data has a line width (1.5 $\mu$m) three times as wide as that of a normal width to reduce the wiring resistance, and the GIO line for the second output data has a line width of 0.5 $\mu$m. The wiring capacity can be reduced by widening the width between the lines.

Figure 14:
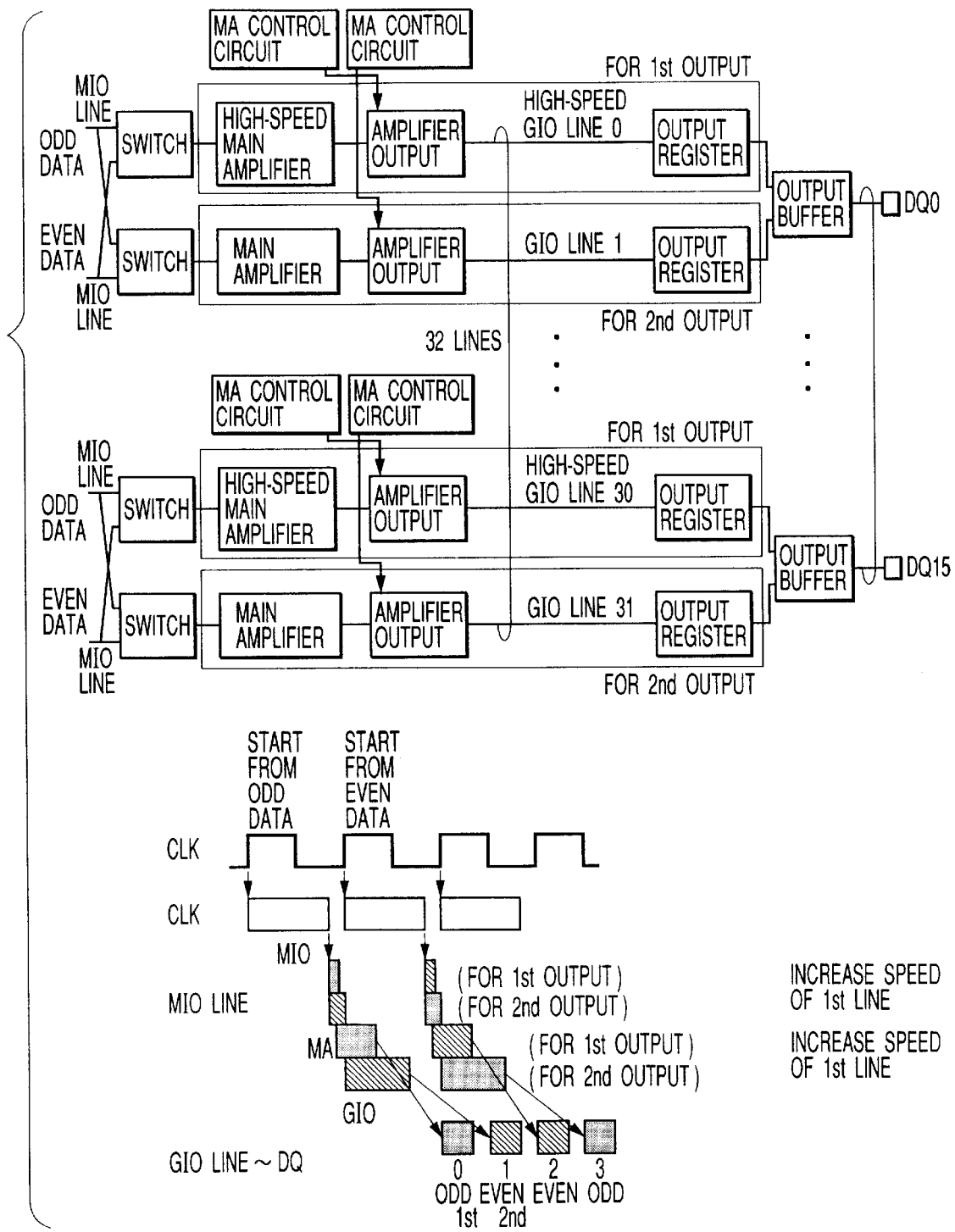
FIG. 14 is a diagram showing the configuration of another embodiment of the read circuit in the DDR SDRAM according to the invention.

FIG. 14 is a diagram showing the configuration of another embodiment of the reading system of the DDR SDRAM according to the invention. The embodiment is a modification of the embodiment of FIG. 12 and is characterized in that the main amplifiers are also assigned for the first output data and second output data. Specifically, the odd-numbered or even-numbered data on the MIO line is switched according to the start address, entered to the main amplifier, and amplified, and the amplified data is outputted. In this case, a high-speed main amplifier is used as the main amplifier for the first output data. That is, a circuit placing priority on the high-speed operation is used. A normal circuit that is different from the high-speed main amplifier is used as the main amplifier for the second output data. That is, a circuit placing priority on reduction in the operation current is used.

As the high speed main amplifier, a static main amplifier (a) is used. Usually, a dynamic main amplifier is used to reduce the operation current. By using the static type, a higher speed can be achieved. Alternately, a two-phase driving main amplifier (b) may be used. By using this circuit, the speed of the GIO line for the first output data serving as an access bus is increased, so that the access time can be shortened.

Figure 15A:
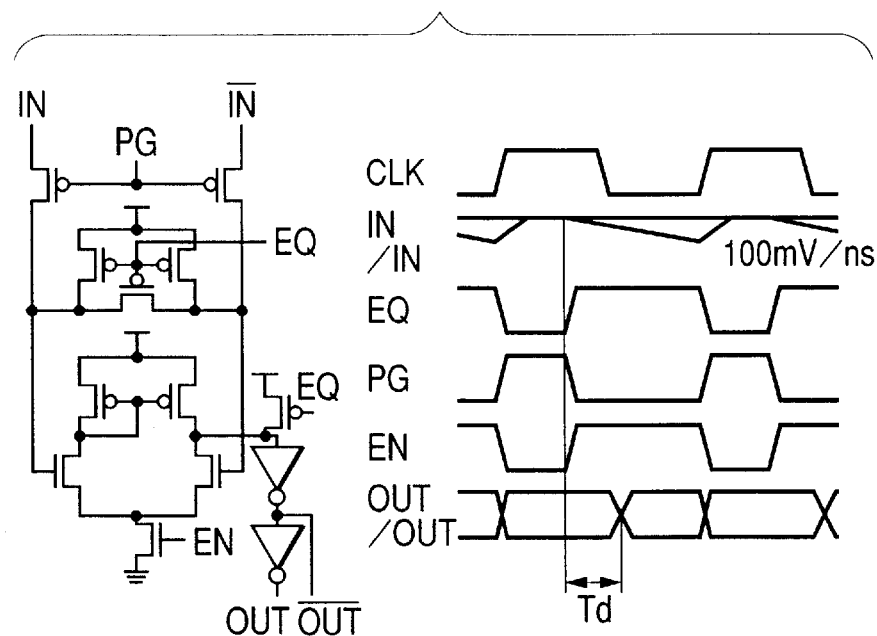
FIGS. 15A and 15B are circuit diagrams of embodiments of a main amplifier in FIG. 14.
Figure 15B:
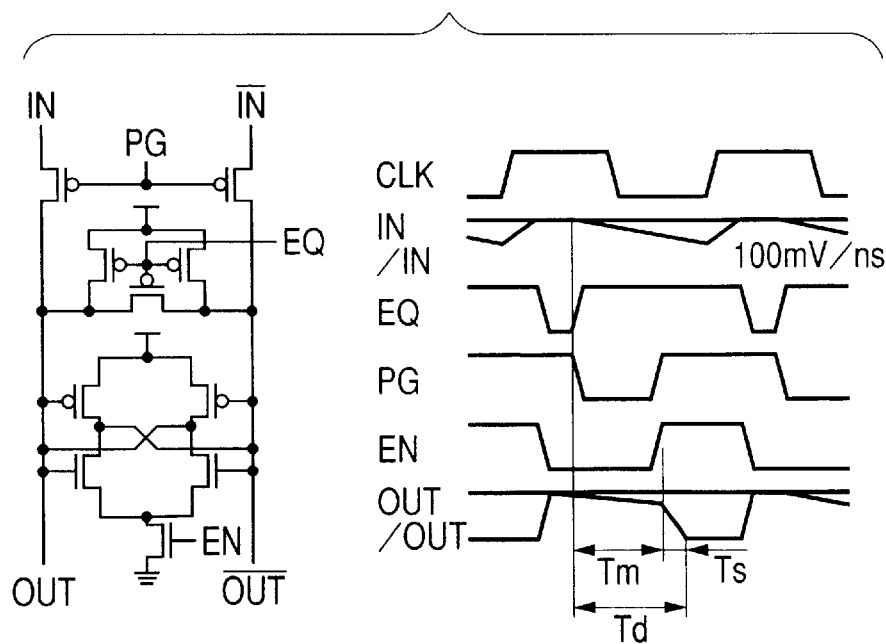

Each of FIGS. 15A and 15B shows an embodiment of the main amplifiers used for the embodiment of FIG. 14. As the high-speed main amplifier, a static amplifier as shown in FIG. 15A is used. As a normal main amplifier, a dynamic amplifier as shown in FIG. 15B is used. The dynamic amplifier is similar to the main amplifiers shown in FIGS. 5 and 10. Since the static amplifier of FIG. 15A does not need a timing margin for assuring the signal amount, the delay time Td until output signals OUT and /OUT are obtained is shortened, thereby realizing high speed. However, since the operation current is continuously passed in the operation period during which a signal EN is at the high level, the current consumption is large.

On the other hand, the dynamic amplifier of FIG. 15B needs a timing margin Tm for assuring a desired signal amount, so that the delay time Td until the output signals OUT and /OUT are obtained is long, and the speed is accordingly low. When the output amplitude becomes large, either the P-channel type MOSFET or N-channel type MOSFET in the latch format is turned off, and the operation current does not flow, so that the current consumption is small. By properly using the main amplifiers as provided in this embodiment in such a manner that a high-speed amplifier is used for only an access path and the normal amplifier is used for each of the other paths, the effective operation speed can be increased and a reduced use of electricity can be realized.

Figure 16:
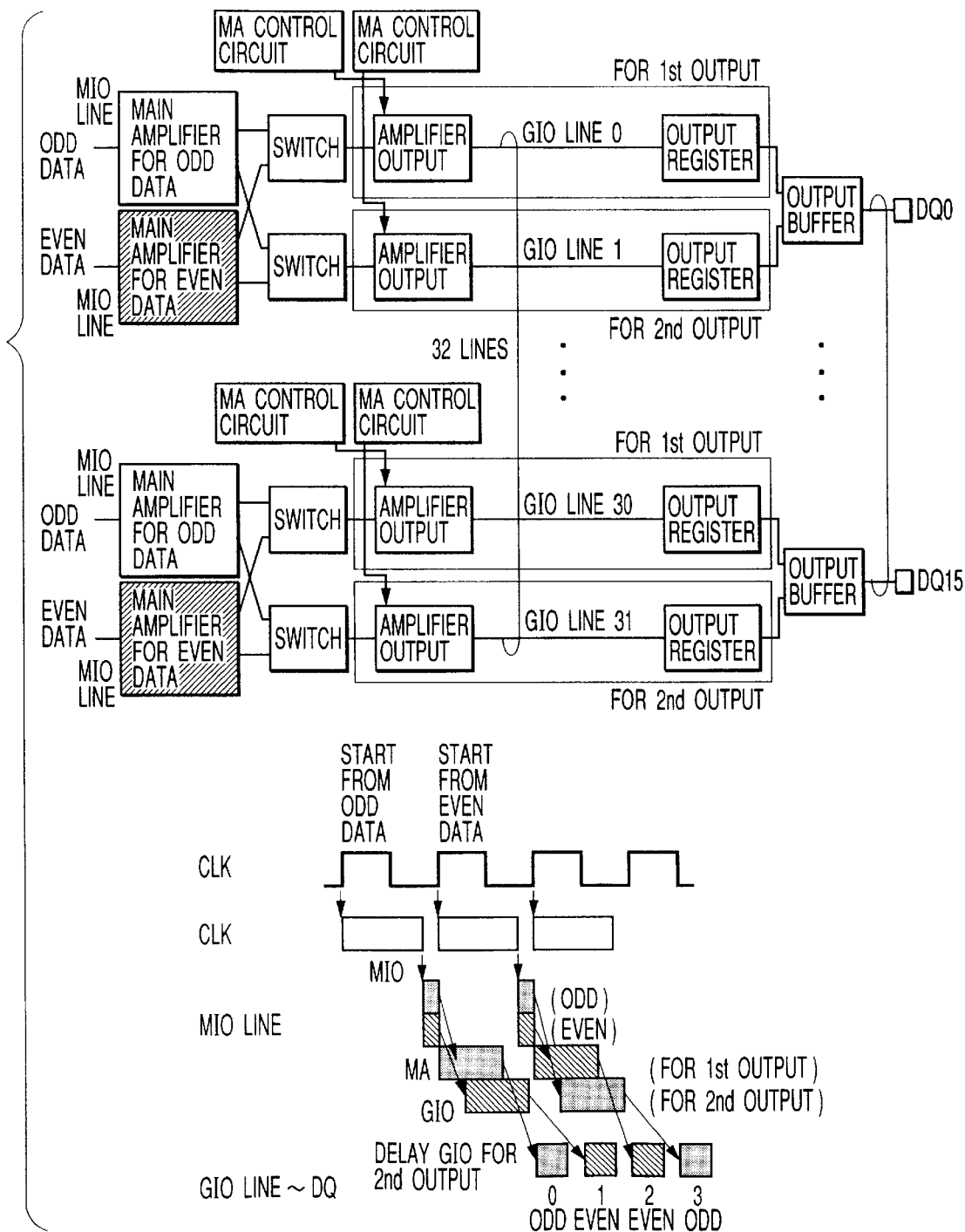
FIG. 16 is a diagram showing the configuration of another embodiment of the read circuit in the DDR SDRAM according to the invention.

FIG. 16 is a diagram showing the configuration of another embodiment of the reading system of the DDR SDPAM according to the invention. The embodiment is a modification of the 2N prefetch architecture, and it is characterized in that transfer of data to the GIO line for the second output data is delayed. Specifically, data is transferred to the GIO line for the first output data in a manner similar to the embodiment of FIG. 12, and data is delayed by a delay circuit and transferred to the GIO line for the second output data as in the embodiment of FIG. 4. Consequently, effects similar to those of the embodiment of FIG. 4 can be produced. Moreover, since data transfer to the GIO line for the second output data is always delayed, a margin can be provided for the timing of data in the next cycle.

Figure 17:
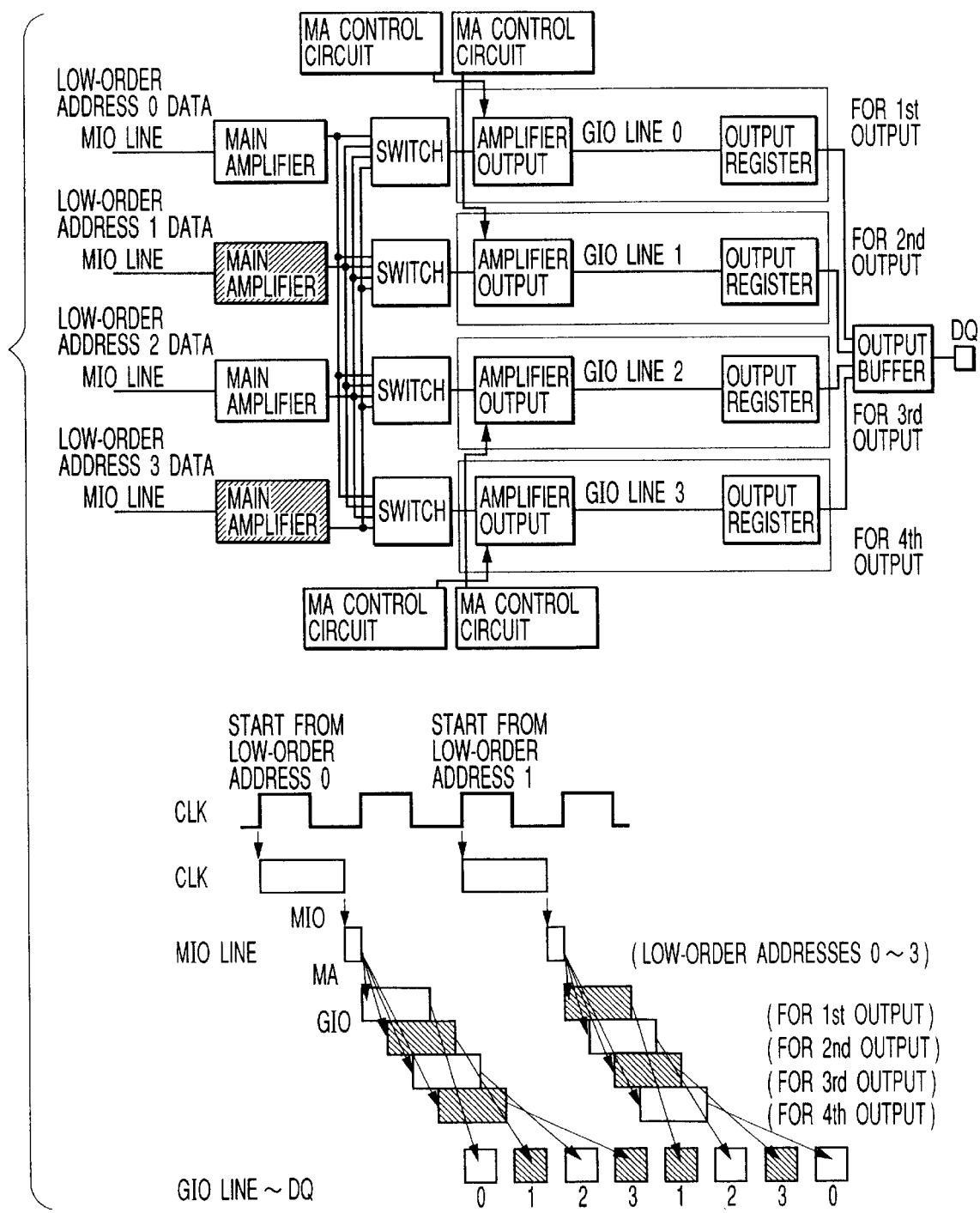
FIG. 17 is a diagram showing the configuration of another embodiment of the read circuit in the DDR SDRAM according to the invention.

FIG. 17 is a diagram snowing the configuration of another embodiment of the reading system of the DDR SDRAM according to the invention. The embodiment is a modification of the embodiment of FIG. 16 and is directed to the 4N prefetch architecture. In the case of the 4N prefetch architecture as well, four bits (when N is 1) are simultaneously sensed by the main amplifiers and are outputted while shifting the timing to GIO lines for the first to fourth output data in accordance with the output order corresponding to the low-order address. Although the embodiment has a configuration in which a main amplifier control circuit is provided for each of the first to fourth output data, for example, a main amplifier control circuit may be commonly used for the first and second output data and data may be outputted every two bits.

Figure 18:
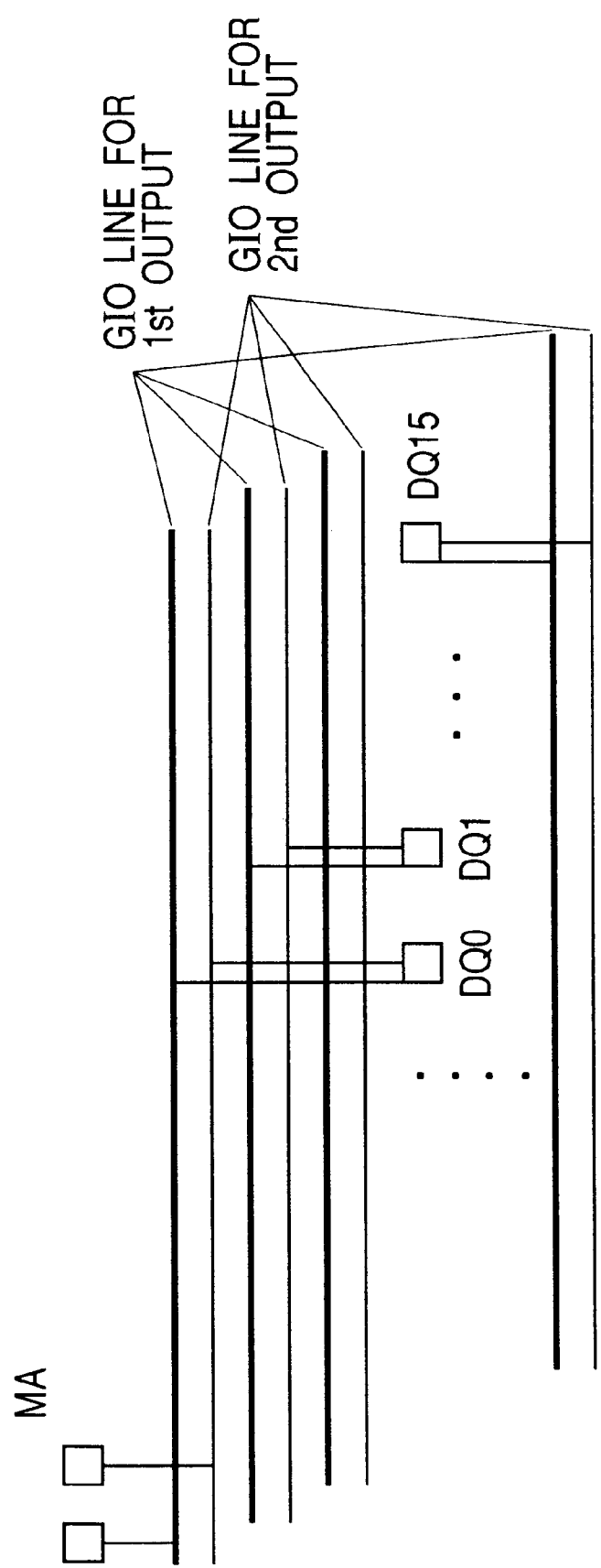
FIG. 18 shows a layout of an embodiment of GIO lines provided for the DDR SDRAM according to the invention.

FIG. 18 shows a layout of an embodiment of GIO lines of the DDR SDRAM according to the invention. The layout of the embodiment of the GIO lines is characterized in that the GIO lines for first output data and GIO lines for second output data in the embodiment of FIG. 16 are alternately arranged. Specifically, in the example of the configuration of the chip in FIG. 2, the 32 GIO lines extending lengthwise in the chip are disposed so that the GIO lines for the first output data and the GIO lines for the second output data are alternately arranged.

By this configuration, when the GIO lines for the first output data are charged/discharged, the GIO lines for the second output data do not operate (because of shifted timing). Thus, the GIO lines for the second output data function as shielding lines. The data transfer speed of the GIO lines for the first output data can be therefore increased. In the embodiment of FIG. 4 as well, by using the layout of arranging the GIO lines for odd-numbered and even-numbered data alternately, a similar effect can be produced.

Figure 19:
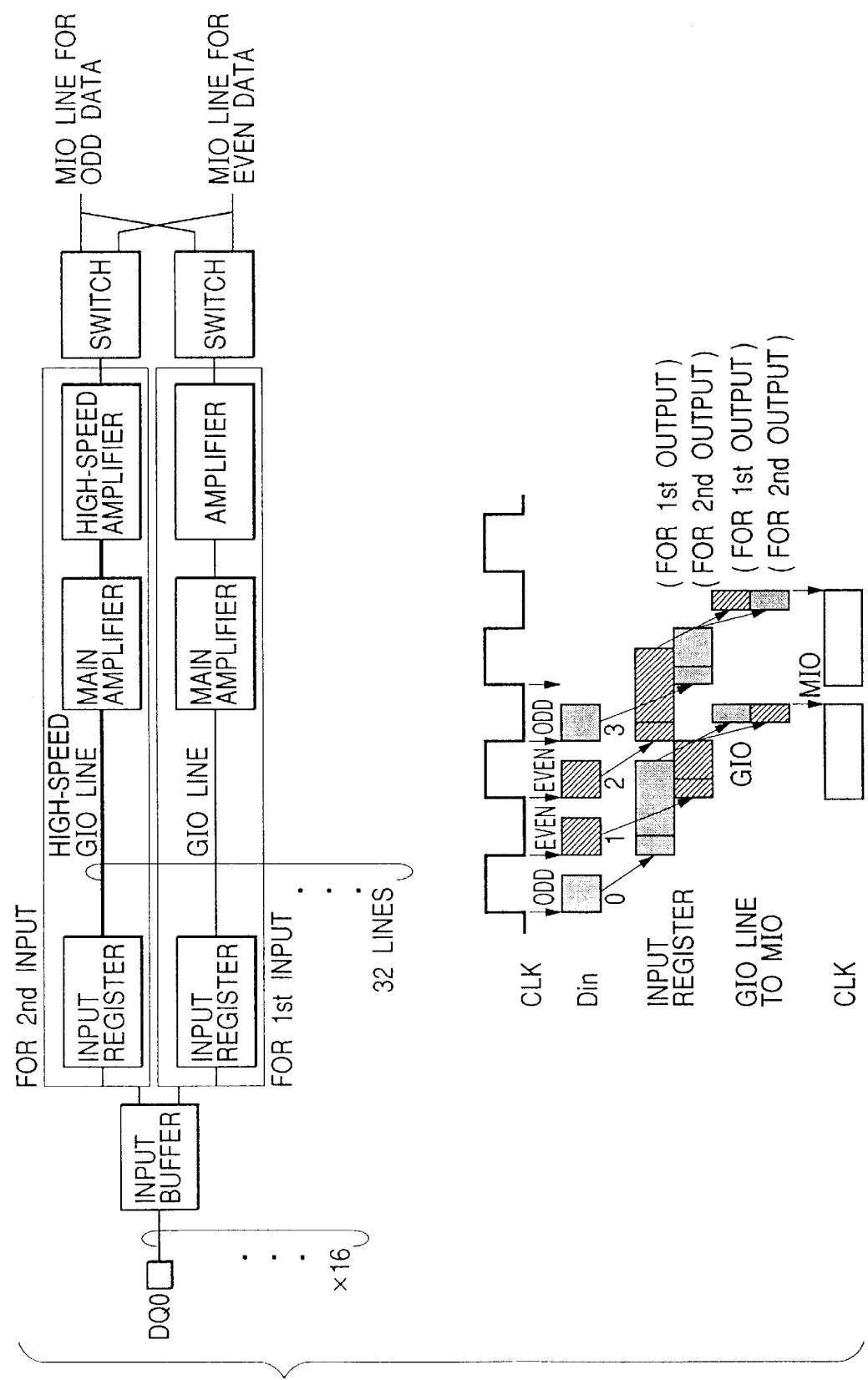
FIG. 19 is a diagram showing the configuration of an embodiment of a write circuit in the DDR SDRAM according to the invention.

FIG. 19 is a diagram showing the configuration of an embodiment of a writing system of the DDR SDRAM according to the invention. The signal transmitting direction of the writing system is reverse to that of the reading system, so that it is sufficient to reverse the signal transmission in each of the embodiments. In the control of the data transfer of the GIO lines from an input buffer in the writing system to the main amplifier, a control similar to that in the reading system is performed on first input data and second input data serially entered.

For example, data is outputted to the GIO line before both odd-numbered and even-numbered data are supplied to the input register. The first input data is transferred first to the GIO line, thereby shifting the timing, and so a reduction in the peak current is realized. In the writing system, the second input data (synchronized with the falling edge of the clock) is worst from the viewpoint of timing. Consequently, it is controlled so as to place priority on the second input data. The second input data is transmitted to an amplifier for writing via the GIO line. After that, the second input data and the first input data transferred previously are written in parallel to 2N memory cells through the MIO lines for the odd-numbered and even-numbered data. Therefore, the second input data (synchronized with the falling edge of the clock) does not have a time margin with respect to the timing.

In the embodiment, therefore, high-speed GIO lines are used as the GIO lines for transferring the second input data and high-speed amplifiers are used as the main amplifiers and write amplifiers, thereby effecting control so that priority is placed on the second input data. Consequently, high transfer speed in the writing system can be realized. By transferring data to the GIO lines, while shifting timings of the data, reduction in peak current can be realized.

Figure 20:
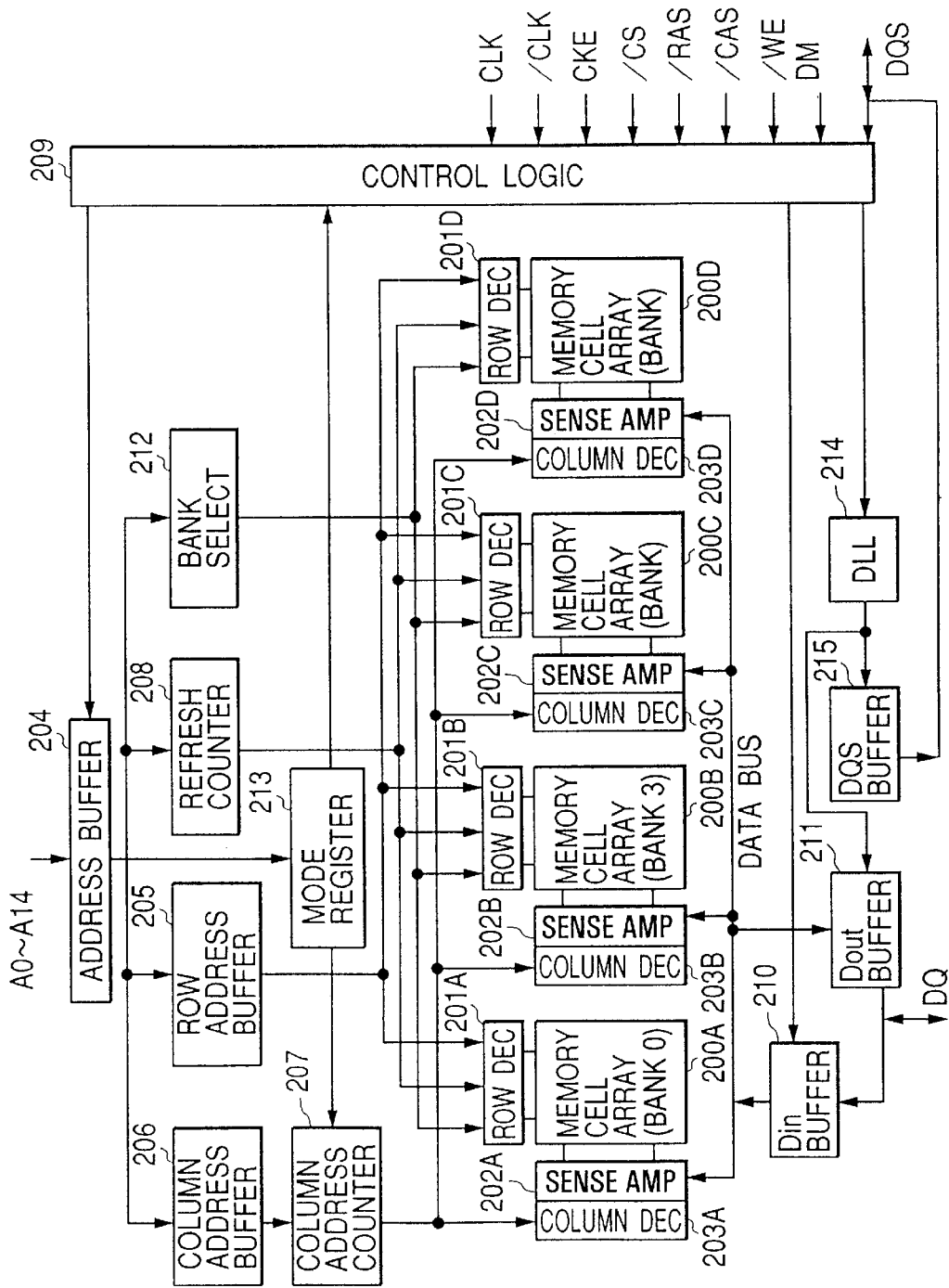
FIG. 20 is a block diagram showing an embodiment of a dynamic RAM to which the invention is applied.

FIG. 20 is a block diagram showing an embodiment of a dynamic RAM to which the invention is applied. The dynamic RAM in the embodiment is directed to the DDR SDRAM. The DDR SDRAM of the embodiment has, but the invention is not so limited, four memory cell arrays 200A to 200D in correspondence with four memory banks in a manner similar to the foregoing embodiment. Each of the memory cell arrays 200A to 200D corresponding to the four memory banks 0 to 3 has dynamic memory cells arranged in the form of a matrix. According to the drawing, memory cell selecting terminals arranged in the same column are coupled to word lines (not shown), and data input/output terminals of the memory cells arranged in the same row are coupled to a complementary data line (not shown) on a row unit basis.

One of the word lines (not shown) in the memory cell array 200A is driven to a selection level in accordance with the result of decoding of a row address signal by a row decoder 201A. The complementary data lines (not shown) of the memory cell array 200A are coupled to the I/O lines of a sense amplifier 202A and a column selection circuit (column DEC) 203A. The sense amplifier 202A is an amplification circuit for sensing and amplifying a small potential difference appearing on each complementary data line in association with an operation of reading data from a memory cell. The column selection circuit 203A includes a switch circuit for selecting one of the complementary data lines and connecting the selected one to the complementary I/O line. The column switch circuit is allowed to perform a selecting operation in accordance with a result of decoding the column address signal by the column decoder 203A.

Similarly, the memory cell arrays 200B to 200D have row decoders 201B to 201D, sense amplifiers 203B to 203D, and column selection circuits 203B to 203D, respectively. The complementary I/O lines for the memory banks are commonly connected to memory banks via a data bus serving as the global input/output line GIO and are connected to an output terminal of a data input circuit (Din buffer) 210 having a write buffer and an input terminal of a data output circuit (Dout buffer) 211. A terminal DQ is, although the invention is not so limited, a data input/output terminal for inputting or outputting data D0 to D15 of 16 bits. A DQS buffer 215 generates a data strobe signal of data outputted from the terminal DQ in a reading operation.

Address signals A0 to A14 supplied from an address input terminal are first held by an address buffer 204. Out of the address signals time-sequentially input, row address signals are hold in a row address buffer 205 and column address signals are held in a column address buffer 206. A refresh counter 208 generates a row address at the time of automatic refresh and self refresh.

For example, when the DDR SDRAM has a storage capacity of 256 Mbits or the like, in the case of performing a memory access on a two-bit unit basis as a column address signal, an address terminal for receiving the address signal A14 is provided. In a "X4" configuration, the address signals up to A11 are made valid. In a "X8" configuration, the address signals up to A10 are made valid. In a "X16" configuration, the address signals up to A9 are made valid. When the DDR SDRAM has a storage capacity of 64 Mbits or the like, in the "X4" configuration, the address signals up to A10 are made valid. In the "X8" configuration, address signals up to A9 are made valid. As shown in the drawing, in the case of the "X16" configuration, the address signals up to A8 are made valid.

An output of the column address buffer 206 is supplied as preset data to a column address counter 207. In a burst mode designated by a command or the like, which will be described hereinlater, the column address counter 207 outputs, as preset data, either a column address signal or a value obtained by sequentially incrementing the column address signal to the column decoders 203A to 203D.

The mode register 213 holds various operation mode information. Only one of the row decoders 201A to 201D which corresponds to a bank designated by a bank select circuit 212 operates to perform a word line selection operation. A control circuit (control logic) 209 receives, although the invention is not so limited, external control signals, such as the clock signals CLK and /CLK (the symbol / indicates that the signal is active low), clock enable signal CKE, chip select signal /CS, column address strobe signal /CAS, row address strobe signal /RAS, and write enable signal /WE, signals /DM and DQS, and address signals supplied via the mode register 213 and generates an internal timing signal for controlling the operation mode of the DDR SDRAM and operation of the circuit block on the basis of a change in level of each of the signals, timing, and the like. The control circuit 209 has input buffers for the signals.

The clock signals CLK and /CLK are supplied to the DLL circuit 214 where an internal clock is generated. The internal clock is used, although the invention is not so limited, as an input signal of the data output circuit 211 and the DQS buffer 215. The clock signal is supplied via the clock buffer to the data input circuit 210 and a clock terminal to be connected to the column address counter 207.

The other external input signals become significant synchronously with the rising edge of the internal clock signal. The chip select signal /CS instructs the start of the command input cycle by its low level. The chip select signal /CS which is at the high level (chip non-selected state) and other inputs are not active. However, a memory bank selection state and an internal operation, such as a burst operation, are not influenced by a change to the chip non-selected state. The signals /RAS, /CAS, and /WE have functions different from those in the corresponding signals in a normal DRAM and are significant when a command cycle to be described hereinlater is defined.

The clock enable signal CKE is a signal for instructing validity of the following clock signal. When the signal CKE is at the high level, the rising edge of the following clock signal CLK is valid. When the signal CKE is at the low level, the rising edge of the following clock signal CLK is invalid. In a read mode, in the case of providing an external control signal /OE for performing output enable control on the data output circuit 211, the signal /OE is also supplied to the control circuit 209. For example, when the signal is at the high level, the data output circuit 211 enters a high output impedance state.

The row address signal is defined by the levels of the address signals A0 to A11 in a row address strobe bank active command cycle, which will be described hereinbelow, synchronized with the rising edge of the clock signal CLK (internal clock signal).

The address signals A12 and A13 are regarded as bank select signals in the row address strobe bank active command cycle. Specifically, by a combination of A12 and A13, one of the four memory banks 0 to 3 is selected. The memory bank selecting control can be performed by, although the invention is not limited thereto, processes, such as activation of only a row decoder on the side of the memory bank to be selected, non-selection of all of the column switch circuits on the side of the memory banks which are not selected, and connection of only the memory bank to be selected to the data input circuit 210 and the data output circuit 211.

In the case where the DDR SDRAM has 256 Mbits and the "X16" configuration, the column address signal is defined by the levels of A0 to A9 in the cycle of a read or write command (a column address read command or column address write command described hereinlater) synchronized with the rising edge of the clock signal CLK (internal clock). The column address defined in such a manner is used as a start address of a burst access.

In the DDR SDRAM, during the burst operation in a memory bank, when another memory bank is designated and the row address strobe bank active command is supplied during the operation, without exerting any influence on the operation being performed in the memory bank, a row address related operation in another memory bank is made possible.

For example, as long as data D0 to D15 does not collide with each other in data input/output terminals of 16 bits, it is possible to issue the precharge command and the row address strobe bank active command to a memory bank different from the memory bank being processed by the command and to preliminarily start the internal operation. The DDR SDRAM of the embodiment performs a memory access on the 16-bit unit basis, has an address of about 4M by the addresses A0 to A11, and is constructed by four memory banks. The DDR SDRAM has therefore a storage capacity of about 256 Mbits (4M×4 banks×16 bits) as a whole.

A detailed reading operation of the DDR SDRAM is as follows. Each of the chip select signals /CS, /RAS, and /CAS and the write enable signal /WE is supplied synchronously with the CLK signal. When the signal /RAS is set to "0", the row address and the bank select signal are entered and held by the row address buffer 205 and a bank select circuit 212, respectively. The row decoder 201 of the bank designated by the bank select circuit 212 decodes the row address signal and data of the whole row is outputted as a small signal from the memory cell array 200. The outputted small signal is amplified and held by the sense amplifier 202. The designated bank is made active.

After elapse of three clocks CLK since the entry of the row address input, when the signal CAS is set to 0, a column address and a bank selection signal are supplied and held by the column address buffer 206 and the bank select circuit 212, respectively. When the designated bank is active, the held column address is outputted from the column address counter 207 and the column decoder 203 selects the column. The selected data is outputted from the sense amplifier 202. The data outputted this time is of two sets (eight bits in the "X4" configuration and 32 bits in the "X16" configuration).

The data outputted from the sense amplifier 202 is outputted via the LIO, MIO, main amplifier, and data bus DataBus from the data output circuit 211 to the outside of the chip. The output timings are synchronized with both the rising and falling edges of QCLK outputted from the DLL 214. The two sets of odd-numbered data and the even-numbered data are subjected to parallel-to-serial conversion, as stated above, and data of (1 set×2) is obtained as a result. Simultaneously with the data output, the data strobe signal DQS is outputted from the DQS buffer 215. When the length of the burst signal stored in a mode register 213 is four or longer, the address of the column address counter 207 is automatically incremented, and the following column data is read.

The role of the DLL 214 is generation of operation clocks for the data output circuit 211 and the DQS buffer 215. It takes time to actually output a data signal and a data strobe signal since the internal clock signal generated by the DLL 214 is input. Consequently, by advancing the phase of the internal clock signal more than the external clock CLK by using an appropriate replica circuit, the phase of the data signal and that of the data strobe signal are made to coincide with the external clock CLK. Therefore, the DQS buffer 215 enters an output high-impedance state rather than the output operation as stated above.

In the writing operation, the DQS buffer 215 in the DDR SDRAM is in the output high-impedance state. Consequently, the data strobe signal DQS is supplied from a data processor, such as a microprocessor, to the terminal DQS, and write data synchronized with the data strobe signal DQS is supplied to the terminal DQ. The data input circuit 210 serially captures the write data input from the terminal DQ synchronously with the clock signal generated on the basis of the data strobe signal supplied from the terminal DQS and converts the write data in parallel synchronously with the clock signal CLK. The parallel data is transmitted to the selected memory bank via the data bus DataBus and written to the selected memory cell in the memory bank.

By applying the present invention to the DDR SDRAM as described above, while achieving the reduction in size of the memory chip, the semiconductor memory to/from which data can be written/read at high speed can be configured.

The action and effect of the foregoing embodiments are as follows.

(1) First and second data is transferred in parallel via a first signal transmission path, amplified by first and second relay amplification circuits, and transferred via a second signal transmission path to first and second output registers, and an output circuit for serially outputting the first and second data held by the first and second output registers, respectively, on the basis of address information is provided. In the first and second relay amplification circuits, an output timing to the second signal transmission path of either the first or second data to be outputted later is delayed with respect to the other data to be outputted first, thereby enabling the peak current consumption at the time of data parallel transfer to be reduced. Thus, while maintaining a high transmission speed, in addition to an improved operation margin, effects such as reduction in area and reduction in power consumption can be realized.

(2) In addition to the above, by outputting the first and second data serially in response to both a rising edge and a falling edge of a clock signal, an effect such that data can be outputted at a rate twice as high as the operation frequency of the internal circuit.

(3) First and second data is transferred in parallel via a first signal transmission path, amplified by first and second relay amplification circuits, and transferred via a second signal transmission path to first and second output registers, and an output circuit for serially outputting the first and second data held by the first and second output registers, respectively, on the basis of address information is provided. Each of the first and second relay amplification circuits is provided with a selection circuit to make either the first or second data to be out-putted first correspond to the first output register and make the other data to be outputted later correspond to the second output register. Thus, an effect is obtained in that the operation of the output circuit can be simplified.

(4) In addition to the above, by serially outputting the first and second data in response to both a rising edge and a falling edge of a clock signal, an effect can be obtained in that data can be outputted at a rate twice as high as the operation frequency of the internal circuit.

(5) In addition to the above, the first relay amplification circuit has first and second amplification circuits for capturing first and second data transmitted via the first signal transmission path, the second relay amplification circuit has the third and fourth amplification circuits for amplifying an output signal to be transmitted to the second signal transmission path, and the selection circuit is provided between output terminals of the first and second amplification circuits and input terminals of the third and fourth amplification circuits to make one of data to be outputted first correspond to the first output register and to make the other data to be outputted later correspond to the second output register. By such a simple configuration, an effect is obtained in that the operation of the output circuit can be simplified.

(6) In addition to the above, the signal transfer rate of the first signal line and the third amplification circuit for driving the first signal line in the second signal transmission path corresponding to the first output register is higher than that of the second signal line and the fourth amplification circuit for driving the second signal line in the second signal transmission path corresponding to the second output register. Thus, while simplifying the operation of the output circuit and increasing the transfer rate, an effect is obtained in that an improved operation margin and, further, reduction in area and reduction in power consumption can be realized.

(7) In addition to the above, the first relay amplification circuit has first and second amplification circuits for receiving first and second data transmitted via the first signal transmission path, and the second relay amplification circuit has third and fourth amplification circuits for amplifying an output signal to be transmitted to the second signal transmission path, and the selection circuit is provided between output terminals of the first and second amplification circuits and input terminals of the third and fourth amplification circuits to make one of the data to be outputted first correspond to the first output register and to make the other data to be outputted later correspond to the second output register. By such a simple configuration, an effect is obtained in that an improved operation margin, moreover, a reduced area, and reduced power consumption can be realized while realizing high signal rate.

(8) In addition to the above, by including the first signal line in the second signal transmission path corresponding to the first output register and the third and first amplification circuits for driving the first signal line, signal transmission rate of the fourth and second amplification circuits for driving the second signal line in the second signal transmission path corresponding to the second output register is increased. Consequently, an effect is obtained in that the transmission rate can be further increased.

(9) In addition to the above, the first signal line in the second signal transmission path is formed with a width wider than that of the second signal line, thereby achieving a small wiring resistance value. Thus, an effect is obtained in that the higher transfer speed can be achieved by an extremely simple configuration.

(10) In addition to the above, by making the output timing to the second signal line by the second relay amplification circuit log the output timing to the first signal line by the first relay amplification circuit, the peak current at the time of signal transfer can be reduced, so that an effect of an improved operation margin is obtained.

(11) In addition to the above, at least two memory cell array areas are further provided in each of a first direction of the semiconductor chip and a second direction orthogonal to the first direction, and they are used to construct memory banks. By applying the invention to a semiconductor memory device including memory arrays constructed by the hierarchical word line method and hierarchical IO method, an effect is obtained in that increased speed of the reading operation can be realized.

(12) In addition to the above, by using a dynamic memory cell, an effect is obtained in that a memory circuit having a small area and a large storage capacity can be achieved.

(13) In addition to the above, by providing the second signal transmission path, first and second output registers, and output circuit in a center portion in the first or second direction of the semiconductor chip, an effect is obtained in that signals are transmitted from the memory arrays (memory banks) almost uniformly.

(14) In addition to the above, an input circuit is further provided, third and fourth data serially input is transmitted to a relay amplification circuit via the second signal transmission path and is held, the fourth data to be input later is transmitted via the first signal line, thereby obtaining an effect in that a high-speed data input can be achieved.

(15) In addition to the above, at least two memory cell array areas are further provided in each of a first direction of the semiconductor chip and a second direction orthogonal to the first direction and are used to construct memory banks. By applying the invention to a semiconductor memory device including memory arrays constructed by the hierarchical word line method and hierarchical IO method, an effect such that increased speed of the writing operation can be realized.

Although the present invention achieved by the present inventor has been specifically described on the basis of the preferred embodiments, obviously the invention is not limited to the foregoing embodiments and can be variously modified without departing from the gist of the invention. For example, the first and second signal transmission paths and the relay amplification circuit can be similarly used for not only the reading system and the writing system, each including a main amplifier and the like provided for the DDR SDRAM, as described above, but also a signal transmission path between the circuit blocks assembled in a system LSI and a signal transmission path between a block and the outside.

The memory circuit is not limited to the dynamic memory cell, but may be a non-volatile memory means using a ferroelectric capacitor or a non-volatile memory cell in which charges are accumulated in a floating gate. The invention can be widely used for various semiconductor integrated circuit devices having a relay amplification circuit, for inputting/outputting data by the parallel-to-serial operation or the prefetch operation.

Effects obtained by representative aspects of the invention disclosed in this application will be described briefly as follows. First and second data is transferred in parallel through a first signal transmission path, amplified by first and second relay amplification circuits, and transmitted via a second signal transmission path to first and second output registers, and an output circuit for serially outputting the first and second data held by the first and second output registers, respectively, on the basis of address information is provided. In the first and second relay amplification circuits, with respect to one data, to be outputted first, of the first and second data, an output timing of the other data to be outputted later to the second signal transmission path is delayed. Consequently, the peak current consumption at the time of data parallel transfer can be reduced, so that while maintaining a high transfer rate, in addition to the improved operation margin, reduction in area and power consumption can be realized.

First and second data is transferred in parallel through a first signal transmission path, amplified by first and second relay amplification circuits, and transmitted via a second signal transmission path to first and second output registers, and an output circuit is provided for serially outputting the first and second data held by the first and second output registers, respectively, on the basis of address information. A selection circuit is provided for each of the first and second relay amplification circuits to make one data, to be outputted first, of the first and second data, correspond to the first output register and to make the other data to be outputted later correspond to the second output register, and the transfer rate of the second signal transmission path corresponding to the first output register is set to be higher than that of the second signal transmission path corresponding to the second output register. Consequently, while simplifying the operation of the output circuit and increasing the transfer rate, in addition to the improved operation margin, reduction in area and power consumption can be realized.

What is claimed is:

1. A semiconductor integrated circuit device comprising:
a first signal transmission path which transfers first and second data in parallel;
first and second relay amplification circuits which receive said first and second data;
a second signal transmission path which transfers said first and second data amplified by said first and second relay amplification circuits;
first and second output registers which receives said first and second data, respectively, transferred via said second signal transmission path; and
an output circuit which serially outputs said first and second data held by said first and second output registers, respectively, on the basis of address information,
wherein said first and second relay amplification circuits delay an output timing to said second signal transmission path of either said first or second data to be outputted later with respect to the other data to be outputted first.

2. A semiconductor integrated circuit device according to claim 1, wherein said first and second data is outputted in series in response to both a rising edge and a falling edge of a clock signal.

3. A semiconductor integrated circuit device according to claim 1,
wherein at least two memory cell array areas are further provided in each of a first direction of the semiconductor chip and a second direction orthogonal to the first direction,
each of said memory cell array areas comprises:
a plurality of memory array areas including a plurality of bit lines provided along said first direction, a plurality of word lines provided along said second direction, and a plurality of memory cells provided in correspondence with intersecting portions between said plurality of bit lines and said plurality of word lines, and disposed in both said first and second directions;
a plurality of sense amplifier areas which are disposed alternately with the plurality of memory array areas along said first direction;
a first common input/output line provided for said sense amplifier area and connected to a corresponding bit line via a first selection circuit;
a second common input/output line connected to a plurality of said first common input/output lines corresponding to the plurality of memory array areas disposed along said first direction via a second selection circuit;
a first select signal generating circuit which supplies a select signal to the plurality of first selection circuits corresponding to the plurality of memory array areas disposed along said first direction; and
a second select signal generating circuit which generates a selection signal of a word line in the plurality of memory array areas disposed along said second direction,
wherein said second common input/output line constructs said first signal transmission path and outputs first and second data in parallel to said relay amplification circuits, and
said second signal transmission path, first and second output registers, and output circuit are commonly provided in correspondence with said memory cell array areas.

4. A semiconductor integrated circuit device according to claim 3,
wherein said memory cell has a MOSFET and a capacitor and is a dynamic memory cell in which a gate of said MOSFET serves as a selection terminal, one of a source and a drain of the MOSFETs serve as input/output terminals, and the other of a source and a drain are connected to a storage node as one of electrodes of said capacitor.

5. A semiconductor integrated circuit device according to claim 4, wherein said second signal transmission path, first and second output registers, and output circuit are provided in a center portion in the first or second direction in said semiconductor chip.

6. A semiconductor integrated circuit device comprising:
a first signal transmission path which transfers first and second data in parallel;
first and second relay amplification circuits which receive said first and second data;
a second signal transmission path which transfers said first and second data amplified by said first and second relay amplification circuits;
first and second output registers which receive said first and second data, respectively, transferred via said second signal transmission path; and
an output circuit which outputs the data held by said first output register first and outputting the data held by said second output register later,
wherein each of said first and second relay amplification circuits has a selection circuit for selecting a signal transmission path so as to make data to be outputted first in the first and second data transmitted via said first signal transmission path correspond to said first output register and make the other data to be outputted later correspond to said second output register.

7. A semiconductor integrated circuit device according to claim 5, wherein said first and second data is outputted in series in response to both a rising edge and a falling edge of a clock signal.

8. A semiconductor integrated circuit device according to claim 6 or 7,
wherein said first and second relay amplification circuits have first and second amplification circuits for capturing first and second data transmitted via said first signal transmission path and third and fourth amplification circuits for amplifying an output signal to be transmitted to said second signal transmission path, respectively, and
said selection circuit is provided between output terminals of said first and second amplification circuits and input terminals of said third and fourth amplification circuits, and
on the basis of address information, performs a first operation for transferring said first data to said third amplification circuit and transferring said second data to said fourth amplification circuit, and a second operation for transmitting said first data to said fourth amplification circuit and transmitting said second data to said third amplification circuit.

9. A semiconductor integrated circuit device according to claim 8, wherein the signal transfer rate of a first signal line and the third amplification circuit for driving the first signal line in said second signal transmission path corresponding to said first output register is higher than that of a second signal line and the fourth amplification circuit for driving the second signal line in said second signal transmission path corresponding to said second output register.

10. A semiconductor integrated circuit device according claim 8,
wherein an output timing to a second signal line by said second relay amplification circuit is behind an output timing to a first signal line by said first relay amplification circuit.

11. A semiconductor integrated circuit device according to claim 10, further comprising an input circuit,
wherein third and fourth data serially input via said input circuit is transmitted to a relay amplification circuit via said second signal line and held, the fourth data to be input later is transmitted to the relay amplification circuit via said first signal line and held, and said third and fourth data held in said relay amplification circuit is transmitted in parallel to said first signal transmission path.

12. A semiconductor integrated circuit device according to claim 11,
wherein at least two memory cell array areas are further provided in each of a first direction of the semiconductor chip and a second direction orthogonal to the first direction,
each of said memory cell array areas comprises:
a plurality of memory array areas including a plurality of bit lines provided along said first direction, a plurality of word lines provided along said second direction, and a plurality of memory cells provided in correspondence with intersecting portions between said plurality of bit lines and said plurality of word lines, and disposed in both said first and second directions;
a plurality of sense amplifier areas which are disposed alternately with the plurality of memory array areas along said first direction;
a first common input/output line provided for said sense amplifier area and connected to a corresponding bit line via a first selection circuit;
a second common input/output line connected to a plurality of said first common input/output lines corresponding to the plurality of memory array areas disposed along said first direction via a second selection circuit;
a first select signal generating circuit which supplies a select signal to the plurality of first selection circuits corresponding to the plurality of memory array areas disposed along said first direction; and
a second select signal generating circuit which generates a selection signal of a word line in the plurality of memory array areas disposed along said second direction,
wherein said second common input/output line constructs said first signal transmission path and outputs first and second data in parallel to said relay amplification circuit, and
said second signal transmission path, first and second output registers, output circuit and said input circuit are commonly provided in correspondence with said memory cell array areas.

13. A semiconductor integrated circuit device according to claim 6 or 7,
wherein said first and second relay amplification circuits comprise first and second amplification circuits for receiving an input signal and third and fourth amplification circuits for amplifying an output signal to be transmitted to said second signal transmission path, respectively, and
said selection circuit is provided between said first signal transmission path and an input terminal of the first amplification circuit and,
on the basis of address information, performs a first operation for transferring said first data to said first amplification circuit and transferring said second data to said second amplification circuit and a second operation for transmitting said first data to said second amplification circuit and transmitting said second data to said first amplification circuit.

14. A semiconductor integrated circuit device according to claim 13,
wherein the signal transmission rate of a first signal line and the third amplification circuit for driving the first signal line in said second signal transmission path corresponding to said first output register is higher than that of a second signal line and the fourth amplification circuit for driving the second signal line in said second signal transmission path corresponding to said second output register.

15. A semiconductor integrated circuit device according to claim 14,
wherein the first signal line in said second signal transmission path has a width wider than that of the second signal line.

16. A semiconductor integrated circuit device comprising:
a first signal transmission path which transmits first and second data in parallel;
first and second amplification circuits which receive said first and second data, respectively, transmitted through said first signal transmission path;
a second signal transmission path which transmits said first and second data amplified by said first and second amplification circuits;
first and second output registers which receive said first and second data, respectively, transmitted via said second signal transmission path; and
an output circuit which serially outputs said first and second data held by said first and second output registers, respectively,
wherein said first and second amplification circuits delay an output timing to said second signal transmission path of either said first or second data to be outputted later with respect to the other data to be outputted first from said output circuit.

17. A semiconductor integrated circuit device according to claim 16, wherein said first and second data is outputted in series in response to both a rising edge and a falling edge of a clock signal.

18. A semiconductor integrated circuit device comprising:
a first signal transmission path which transmits first and second data in parallel;
first and second amplification circuits which receive said first and second data transmitted through said first signal transmission path;
a second signal transmission path which transmits said first and second data amplified by said first and second amplification circuits;
first and second output registers which receive said first and second data, respectively, transferred via said second signal transmission path; and
an output circuit which outputs the data held in said first output register first and outputting the data held in said second output register later, wherein a selection circuit is provided for making one, to be outputted first from said output circuit, of said first and second data transmitted via said first signal transmission path correspond to said first output register and making the other data to be outputted later correspond to said second output register.

19. A semiconductor integrated circuit device according to claim 18, wherein said first and second data is outputted in series in response to both a rising edge and a falling edge of a clock signal.

20. A semiconductor integrated circuit device according to claim 18 or 19, wherein said selection circuit performs, on the basis of the address information, a first operation for transmitting said first data to said first amplification circuit and transferring said second data to said second amplification circuit and a second operation for transmitting said first data to said second amplification circuit and transmitting said second data to said first amplification circuit.

21. A semiconductor integrated circuit device according to claim 20, wherein the signal transfer rate of the first amplification circuit for driving a first signal line in said second signal transmission path corresponding to said first output register is increased so as to be higher than that of the second amplification circuit for driving a second signal line in said second signal transmission path corresponding to said second output register.

22. A semiconductor integrated circuit device according to claim 20, wherein the signal transfer rate of a first signal line in said second signal transmission path corresponding to said first output register is increased so as to be higher than that of a second signal line in said second signal transmission path corresponding to said second output register.

23. A semiconductor integrated circuit device according to claim 22, wherein the first signal line in said second signal transmission path is formed with a line width wider than the second signal line.

* * * * *